United States Patent [19]
Distinti

[11] Patent Number: 5,202,687
[45] Date of Patent: Apr. 13, 1993

[54] ANALOG TO DIGITAL CONVERTER

[75] Inventor: Robert J. Distinti, Fairfield, Conn.

[73] Assignee: Intellectual Property Development Associates of Connecticut, Trumbull, Conn.

[21] Appl. No.: 714,246

[22] Filed: Jun. 12, 1991

[51] Int. Cl.⁵ ............................................. H03M 1/38
[52] U.S. Cl. .................................. 341/158; 341/162
[58] Field of Search ............... 341/158, 159, 161, 162, 341/122, 123, 124, 125, 155, 166

[56] References Cited

U.S. PATENT DOCUMENTS

| | | | |
|---|---|---|---|
| 3,161,868 | 12/1964 | Waldhauer . | |
| 3,187,325 | 6/1965 | Waldhauer . | |
| 3,577,139 | 5/1971 | Foerster | 341/162 |
| 3,968,486 | 7/1976 | Gerdes . | |
| 4,072,938 | 2/1978 | Buchanan | 341/172 |
| 4,275,386 | 6/1981 | Michel et al. | 341/159 |
| 4,325,054 | 4/1982 | van de Plassche . | |
| 4,375,059 | 2/1983 | Schlig | 341/162 |
| 4,599,602 | 7/1986 | Matzuzawa et al. . | |
| 4,611,196 | 9/1986 | Fernandez | 341/158 |
| 4,684,924 | 8/1987 | Wood | 341/158 X |
| 4,745,394 | 5/1988 | Cornett | 341/158 X |
| 4,769,628 | 9/1988 | Hellerman | 341/162 |
| 4,978,959 | 12/1990 | Chong et al. | 341/162 X |
| 4,994,808 | 2/1991 | Wichelman | 341/162 X |

Primary Examiner—Sharon D. Logan

[57] ABSTRACT

An Operational Analog to Digital (SYMAD) Convertor cell for converting an analog signal into a discrete binary code. An analog signal is processed by sample and hold circuitry and then compared to a reference voltage by a comparator. The comparator output is the converted digital output. This output is coupled back to the control input of an analog switch which selects either the reference voltage or a predetermined potential, typically zero volts, to couple to an inverting input of an operational amplifier. The analog signal input is also coupled to the non-inverting input of the operational amplifier. The operational amplifier is configured as a differential amplifier with a gain of two. If the digital output of the comparator is a logic 1, then the operational amplifier output is two times the difference between the analog signal and the reference voltage. If the digital output of the comparator is a logic 0, then the output of the operational amplifier is two times the analog signal. As many SYMAD cells as necessary may be provided to obtain a desired resolution.

35 Claims, 34 Drawing Sheets

TIMING DIAGRAM FOR PIPELINED ADC

CELL FOR CYCLIC COMPRESSION LD CELL $V_R$ = BASE FOR CYCLIC COMPRESSION $R_T$ IS A TERMINATING RESISTOR

ANALOG TO DIGITAL CONVERTER

FIELD OF THE INVENTION

This invention relates generally to analog to digital converter circuitry and, in particular, to embodiments of simplified analog to digital converter cells and to analog to digital converters constructed therefrom.

BACKGROUND OF THE INVENTION

An analog to digital converter (ADC) converts an analog signal into a discrete binary code suitable for digital processing. There are several factors that determine whether or not a particular ADC is suited to a particular application, including complexity, cost, conversion time, resolution, accuracy and performance over temperature. However, the ADC's currently available have numerous deficiencies in one or more of those areas.

U.S. Pat. No. 3,968,486 teaches an ADC that utilizes a plurality of analog comparators, wherein each comparator receiving an analog input signal and a separate unique reference signal. The total analog to digital conversion time is nT, where n is the number of comparator stages and T is the response time of the comparator. U.S. Pat. No. 4,599,602 teaches a serial-type ADC utilizing folding circuit cells. The first cell receives a reference voltage. Each cell's output signal polarities are inverted with respect to the input signal polarities. The output of this ADC is direct-gray binary reflected code, not a natural binary code. Additional circuitry is required to convert the output to natural binary.

It is one object of the invention to provide an ADC that has a very low parts count, thereby reducing complexity and cost while increasing accuracy.

It is another object of the invention to provide an ADC in which all ADC cells employ a common reference signal.

It is another object of the invention to provide an ADC in which the conversion rate remains constant as a resolution of an output binary code increases.

It is another object of the invention to provide an ADC that includes an analog delay-line function.

It is another object of the invention to provide a ADC having temperature stability.

It is another object of the invention to provide an ADC that can also be used as a digital to analog converter (DAC) without adding components or changing component values.

It is a further object of the invention to provide an ADC that operates to yield true logarithmic compression.

It is one further object of the invention to provide an ADC that has a direct floating point output consistent with industry standard format.

It is also an object of the invention to provide an ADC that uses a single cell in a recursive (cyclic) fashion to provide n-bits of resolution.

SUMMARY OF THE INVENTION

The foregoing problems are overcome and the objects of the invention are realized by a Symmetrical Analog to Digital (SYMAD) Converter cell for converting an analog signal into a discrete binary code. In accordance with an embodiment of the invention the analog input signal, after being processed by sample and hold circuitry, is compared by a comparator to a reference voltage. The output of the comparator is a logic one when the analog input signal is greater than the reference voltage. The output of the comparator is a logic zero when the analog input signal is less than the reference voltage. If the inputs to the comparator are reversed, such that the analog input signal is coupled to an inverting input of the comparator and the reference signal is coupled to a non-inverting input, a logic zero indicates that the analog signal is greater than the reference voltage and a logic one indicates that the reference voltage is greater than the analog input. The digital output is coupled back to a control input of an analog switch which selects either the reference voltage or a predetermined potential, typically zero volts, to couple to the inverting input of an operational amplifier. The analog signal input is also coupled to a non-inverting input to the operational amplifier. The operational amplifier is configured, in one embodiment of the invention, as a differential amplifier with a gain of two. If the digital output of the comparator is a logic one, the operational amplifier output is two times the difference between the analog signal and the reference voltage. If the digital output of the comparator is a logic zero, the output of the operational amplifier is two times the analog signal. The analog output signal is coupled to the analog input of a next SYMAD converter cell.

In accordance with an aspect of the invention, as many SYMAD cells as necessary may be provided to obtain a desired resolution. This is accomplished by interconnecting the SYMAD cells in such a manner that the analog output of one cell is coupled to the analog input of a next SYMAD cell. All of the SYMAD cells utilize the same reference voltage. For this configuration the conversion time is a linear function of the number of digital output bits.

In a further embodiment of the invention each SYMAD cell, after the first SYMAD cell, receives a reference voltage that is one-half of the magnitude of the preceding SYMAD cell's reference voltage. This embodiment exhibits a conversion time that is a logarithmic function of the number of digital output bits.

A further embodiment of the invention provides a cyclic ADC that utilizes a single SYMAD cell. This embodiment of an ADC has a very low component count relative to a multi-cell converter having a similar number of bits of resolution. In that there are relatively few components, laser trimming may be performed during the manufacturing process to provide components of high accuracy. A low parts count also decreases the total error propagation in that the summation of the variations of component tolerance values is reduced.

Conversion times of one microsecond per bit, or faster, are readily achieved, yielding 60,000 16-bit conversions per second. This high rate of conversions makes this ADC suitable for use in compact disk recorders and other applications where high continuous data rates are required.

A further embodiment of the invention provides a Chopper Stabilized Cyclic ADC that further improves the accuracy of the Cyclic ADC. In this embodiment, dual Chopper Stabilized Cyclic ADC's are operated in an alternate fashion, wherein a first chopper stabilized ADC converts a sampled analog signal into n-bits, while the second chopper stabilized ADC is maintained in a non-conversion (zeroing) state. After, the first chopper stabilized ADC converts n-bits, the second chopper stabilized ADC converts a next sampled analog signal into n-bits. The chopper stabilized ADC's thus alternate in the conversion process, with one converting while the other is operated to null inherent offsets.

Another embodiment of the invention is a Pipelined Analog to Digital Converter that comprises a plurality of SYMAD cells, sample and hold circuits, and digital shift registers. The digital shift registers are arranged to provide a delay function such that the converted bits of a particular sample arrive at the outputs simultaneously. This embodiment also employs an analog shift register function, wherein a sampled analog signal is shifted through (n) cells, where (n) is the digital output bit resolution. This embodiment yields a conversion rate that is constant regardless of the digital output bit resolution. Furthermore, additional SYMAD cells may be added to increase resolution without adversely affecting the conversion rate.

Another embodiment of the invention provides a switched resistor ADC cell that may also be employed to construct a Digital to Analog Converter (DAC).

Another embodiment of the invention provides a synchronous SYMAD converter cell, wherein a digital output signal "D" and an internal sample and hold network are synchronized to a clock edge to permit synchronous AD conversion and to improve the simplicity and speed of both the cyclic and the pipelined type converters.

BRIEF DESCRIPTION OF THE DRAWINGS

The above set forth and other features of the invention will be made more apparent in the ensuing Detailed Description of the Invention when read in conjunction with the attached drawings, wherein.

DETAILED DESCRIPTION OF THE INVENTION

Figure 1:
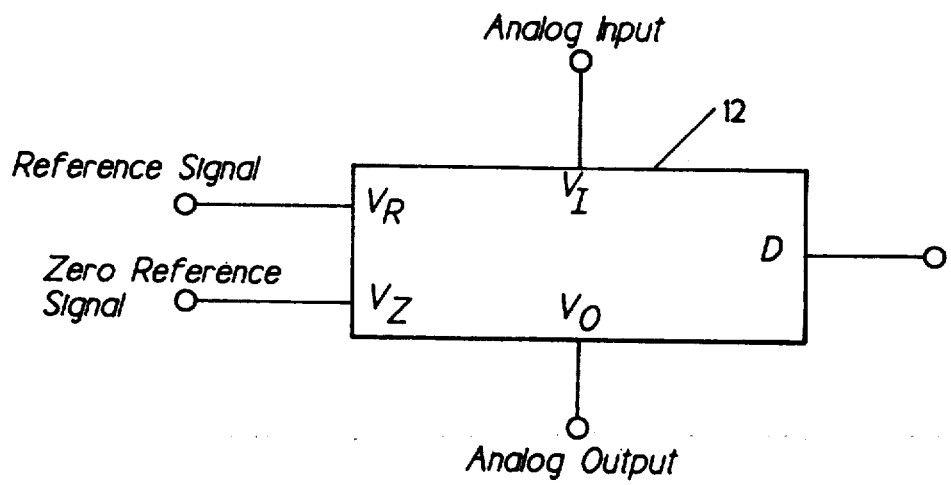
FIG. 1 is a block diagram that illustrates the SYMAD converter cell.
Figure 15:
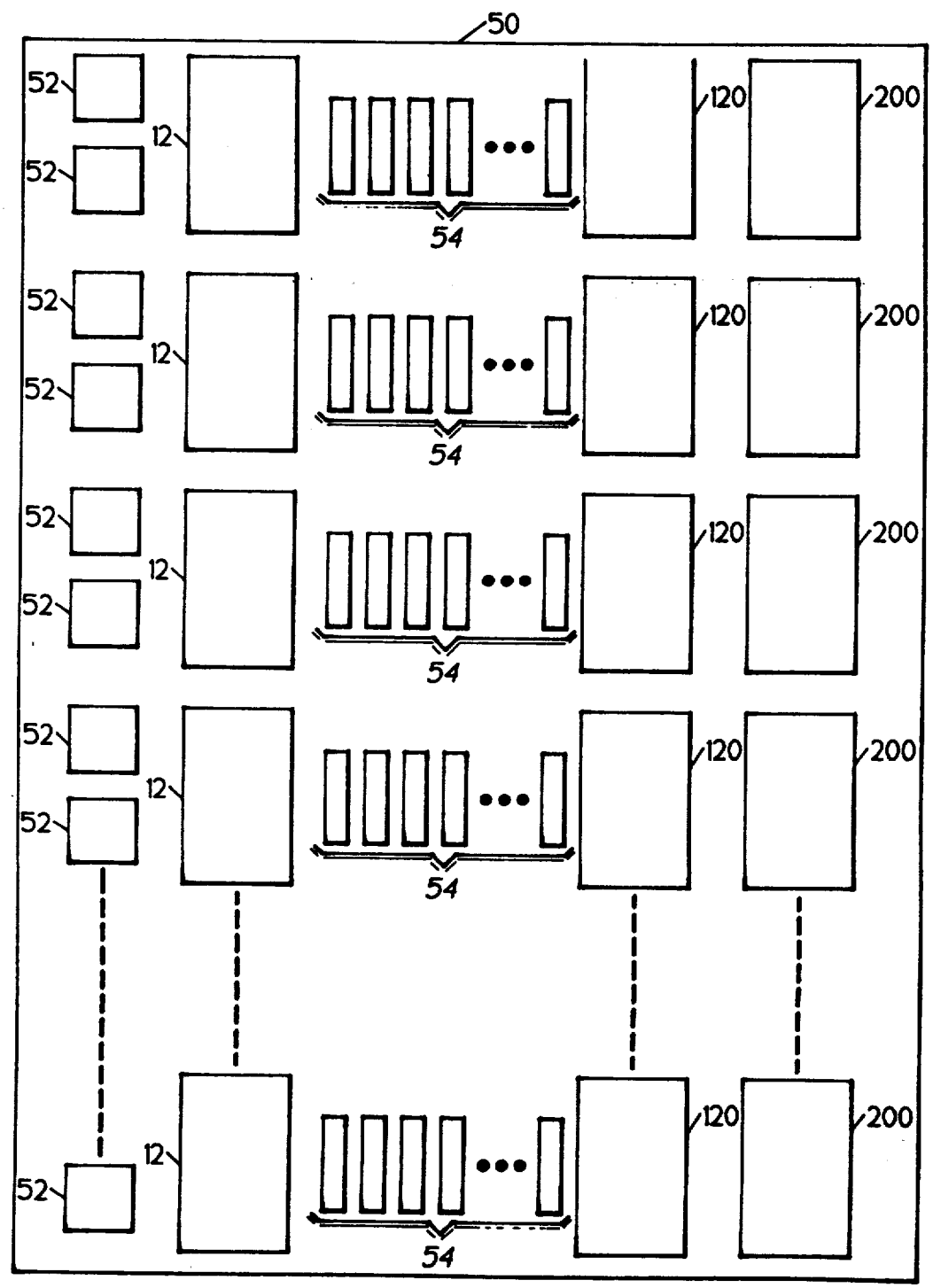
FIG. 15 shows a simplified lay out of a monolithic programmable converter array (PCA).

FIG. 1 is a block diagram of a single SYMAD converter cell 12. The analog to digital conversion function for a specific application may be optimized by the number of SYMAD cells used, and in the manner in which the SYMAD cells are interconnected. As will become apparent, this type of cellular structure lends itself to the construction of a monolithic Programmable Converter Array (PCA), as shown in FIG. 15, which is similar conceptually to a programmable logic array (PLA) or programmable array logic (PAL). The user, however, employs a plurality of SYMAD cells and support circuitry to customize an ADC, rather than a logic function.

The basic SYMAD cell 12 shown in FIG. 1 includes three inputs and two outputs. The $V_I$ input is the analog signal input, the $V_R$ input is the reference voltage input, the $V_z$ input is a zero reference, the "D" output is a single bit data output (digital output), and $V_O$ is the analog output.

The reference voltages are assigned as follows: $V_Z$ is the most negative value of the input signal. If the input signal reaches $V_Z$, the digital output of the converter, regardless of resolution, will be zero.

$V_{FS}$ is the full scale voltage or the most positive value of the input signal. If the input signal reaches $V_{FS}$ then the digital outputs of the converter will all be logic high regardless of resolution.

For the initial cell (MSB) $V_R$ is defined as the midpoint between and $V_{FS}$ and $V_Z$. $V_R$ of a succeeding cell is half of this value, and so on. Thus, the reference voltages are weighted binarily. If the gain of the SYMAD cells are set to two, then $V_R$ of all cells is the same and reflects:

$$V_R = \frac{V \text{ full scale} + V_Z}{2}$$

Figure 2A:
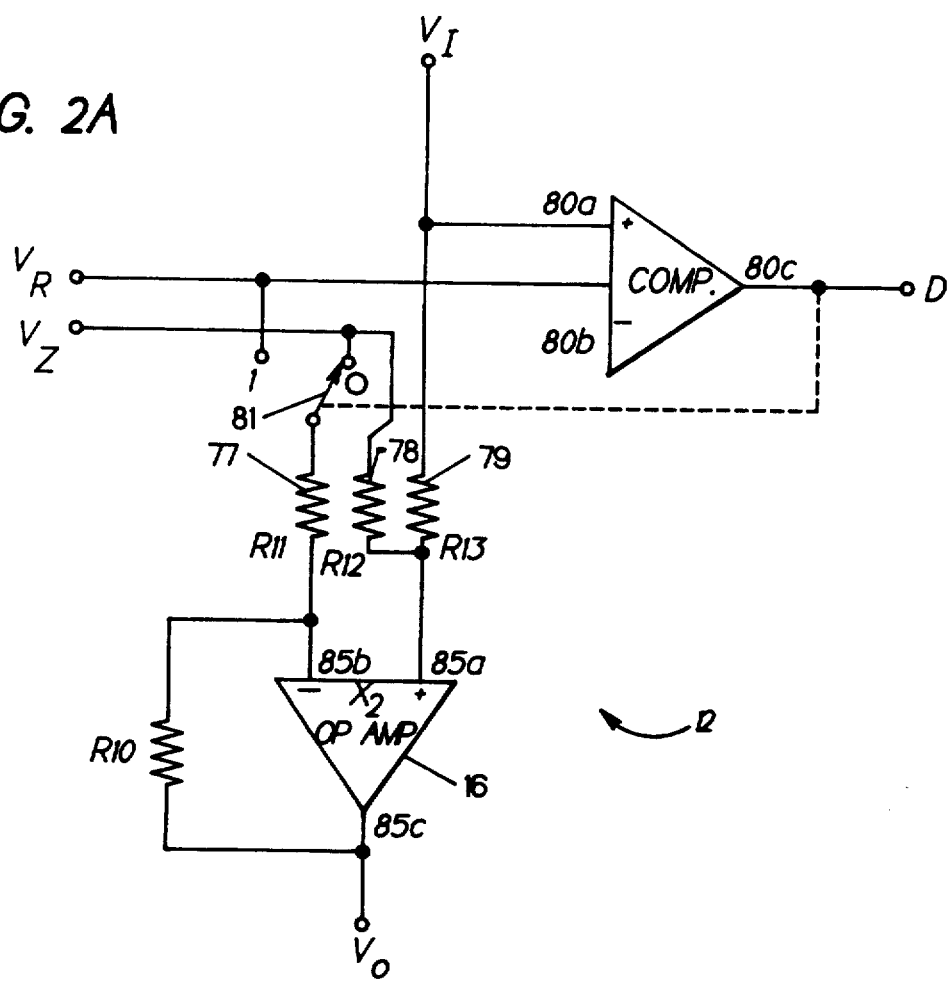
FIG. 2A is a detailed schematic diagram of a bipolar SYMA cell.

FIG. 2A shows a bipolar SYMAD cell. For some applications, $V_z$ may be coupled to ground or to some predetermined voltage potential. The analog input signal $V_I$ is coupled to the non-inverting (+) input 80a of the comparator 75 and the reference voltage $V_R$ is coupled to the inverting (−) input 80b of the comparator 75. The "D" output 80c of the comparator 75 is a logic one when the analog input signal $V_I$ is greater than the reference voltage $V_R$. The "D" output 80c, in addition to being coupled to an external device, is coupled to a control terminal of a single pole-double throw (SPDT) switch or relay 81. The switch 81 has terminals coupled to the reference voltage $V_R$ and to the zero reference $V_z$. Thus, switch 81 passes either the reference voltage $V_R$ or the zero reference $V_z$ to R77, depending on the logic level of the "D" output 80C. The analog input signal $V_I$ is coupled to R79.

The operational amplifier (Op-Amp) 76 preferably has a low offset current, low offset voltage and low bias current drift. One suitable operational amplifier with these characteristics is manufactured by National Semiconductor and is referred to as an LF 411. The Op-Amp 76 in FIG. 2A is configured as a differential amplifier having a gain of two.

A typical value for resistors R11 and R13 is 100K ohms, while R10 and R12 are 200K ohms.

The gain for such a configuration can be expressed as:

$$V_O = V_1[R12/(R12+R13)][(R10+R11)/R11] + V_2[-1-(R10+R11)/R11] + V_2[(R10+R11)/R10][1-R12/(R12+R13)],$$

where $V_1$ is the input signal coupled to the non-inverting (+) terminal 85a of the Op-Amp 76 through resistor R13 and $V_2$ is the input signal coupled to the inverting terminal (−) 85b of the Op-Amp 76 through R11. Since, for this embodiment, R10 is equal to twice the value of R11, the gain of the Op-Amp 76 is two, and the Op-Amp's output $V_O$ 85c can be expressed as:

$$V_O = 2(V_1 - V_2) + V_Z.$$

The accuracy of the differential amplifier is improved if 1% tolerance metal film resistors are used and if the op-amps' offset null is zeroed by conventional methods.

When the "D" output 80c is a logic one, the switch 81 passes the reference voltage $V_R$ to R11. For this case, the analog output 85C of the Op-Amp 76 is expressed as:

$$V_O = 2(V_I - V_R) + V_Z.$$

If $V_z$ is grounded then the output is expressed as:

$$V_O = 2(V_I - V_R).$$

When the "D" output 85C is a logic zero, the switch 81 passes the zero reference $V_Z$ to R11. In this case, $V_1 = V_I$ and $V_2 = V_Z$. The output of the Op-Amp 76 can thus be expressed as:

$$V_O = 2(V_1 - V_2) + V_Z,$$

$$V_O = 2(V_I - V_Z) + V_Z, \text{ and}$$

$$V_O = 2 \text{ or } 2V_I \text{ for } V_Z \text{ grounded}.$$

The mathematical expression defining the operation of the bipolar SYMAD can therefore be expressed as $$V_O = 2[V_I - V_Z - d(V_R - V_Z)] + V_Z,$$
$$= 2(V_I + V_R) + V_Z \quad \text{for } d = 1, \text{ or}$$
$$= 2V_I - V_Z \quad \text{for } d = 0,$$

where "D" is the digital output of the SYMAD cell and $d=1$ for D=logic one and $d=0$ for D=logic zero.

Figure 2B:
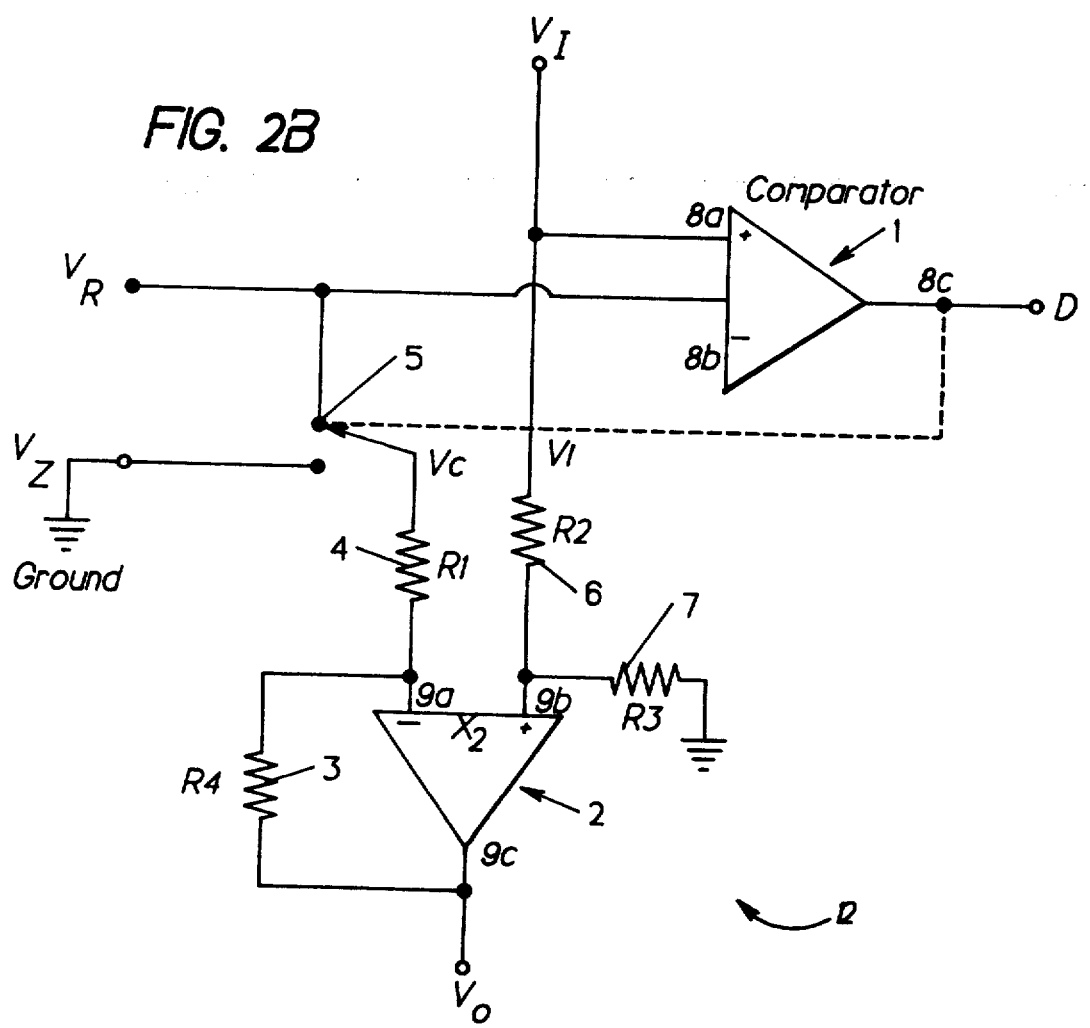
FIG. 2B is a detailed schematic diagram of unipolar SYMAD cell.

FIG. 2B shows a detailed schematic of a unipolar SYMA cell.

This cell is similar to the bipolar cell, except that the zero reference is coupled to ground. The Op-Amp 2 has a gain of two. A typical value for resistors R1 and R2 is 100K ohms, while R3 and R4 are each 200K ohms.

The mathematical expression defining the operation of the unipolar SYMAD cell is expressed as:

$$V_O = 2(V_I - dV_R),$$
$$= 2(V_I - V_R) \quad \text{for } d = 1, \text{ or}$$
$$= 2V_I \quad \text{for } d = 0,$$

where "d" is related to digital output of the SYMAD cell, as before.

Figure 2C:
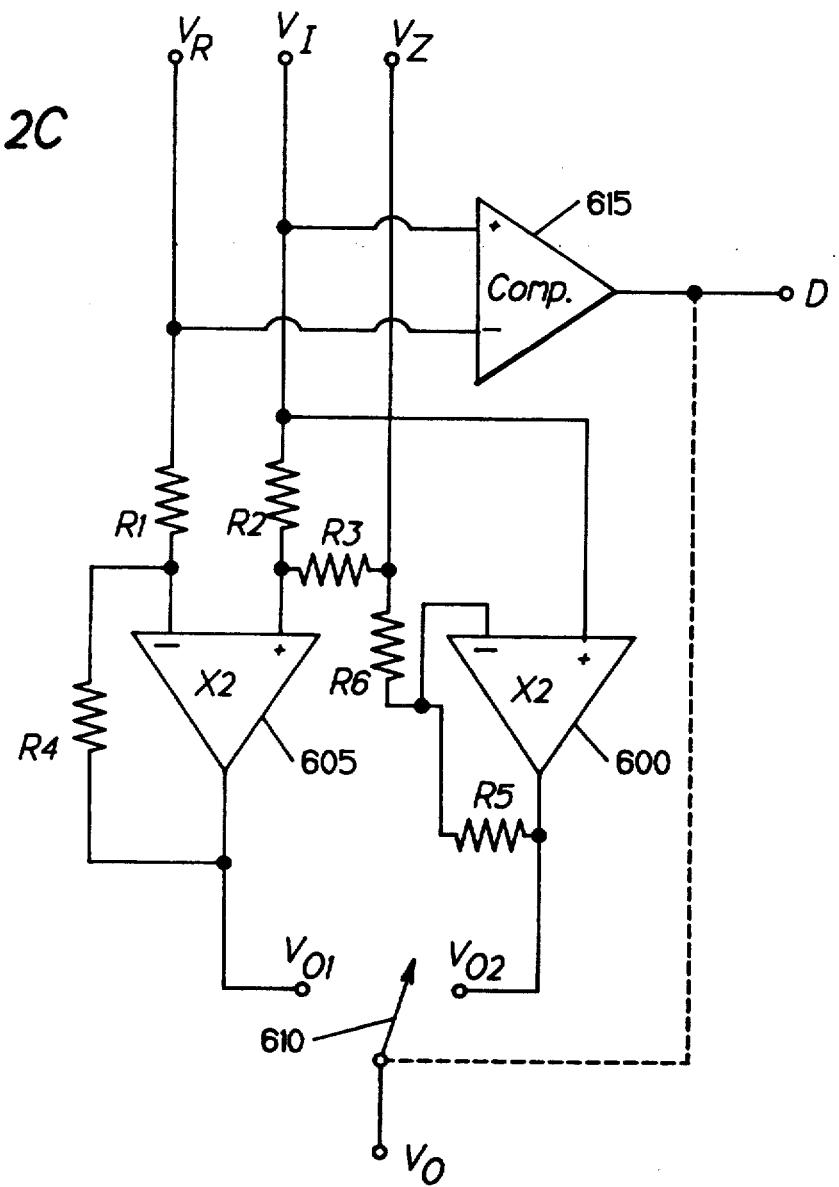
FIG. 2C is a detailed schematic of a dual operational amplifier bipolar SYMAD cell.

FIG. 2C shows a Dual Op-Amp Bipolar SYMAD cell. In this embodiment, two amplifiers are used, each having a gain of two. The first Op-Amp 605 has an output $V_{O1}=2(V_I+V_R)+V_Z$, while the second Op-Amp 600 has an output $V_{O2}=2V_I-V_Z$. Both outputs are coupled to switch 610 inputs. The switch 610 is controlled by the digital output signal of the comparator 615. A logic one digital signal causes the switch 610 to pass $V_{O2}$ to the analog output terminal, and a logic zero causes $V_{O1}$ to be coupled to the analog output terminal. In this embodiment, the settling time of the operational amplifiers is not dependent on the output of the comparator 615 or switch 610. This reduces the total propagation delay of the analog signal through the cell, decreasing the time it takes a second cell (not shown) to receive the analog output signal from the previous cell.

For the embodiments discussed thus far the analog delays are as follows:

| Configuration | Delay (Analog In/Analog Out) |
|---|---|
| FIG. 2A, 2B | Tsc + Tsw + Tso = $T_D$ |
| FIG. 2C | Tso = $T_D$ |

This is true for Tso > Tsc+Tsw, which is normally the case.

Tsc is the settling time of the comparator, Tsw is the switching time of the switch, Tso is the operational amplifier settling time, and $T_D$ is the total propagation delay from the time the analog input signal enters the cell, to the time an analog output signal is available at the output of a cell. If the embodiment in FIG. 2C is utilized to construct an n-bit ADC, the conversion rate is nTso faster than an n-bit ADC employing the SYMAD cells shown in FIGS. 2A and 2B.

Figure 2D:
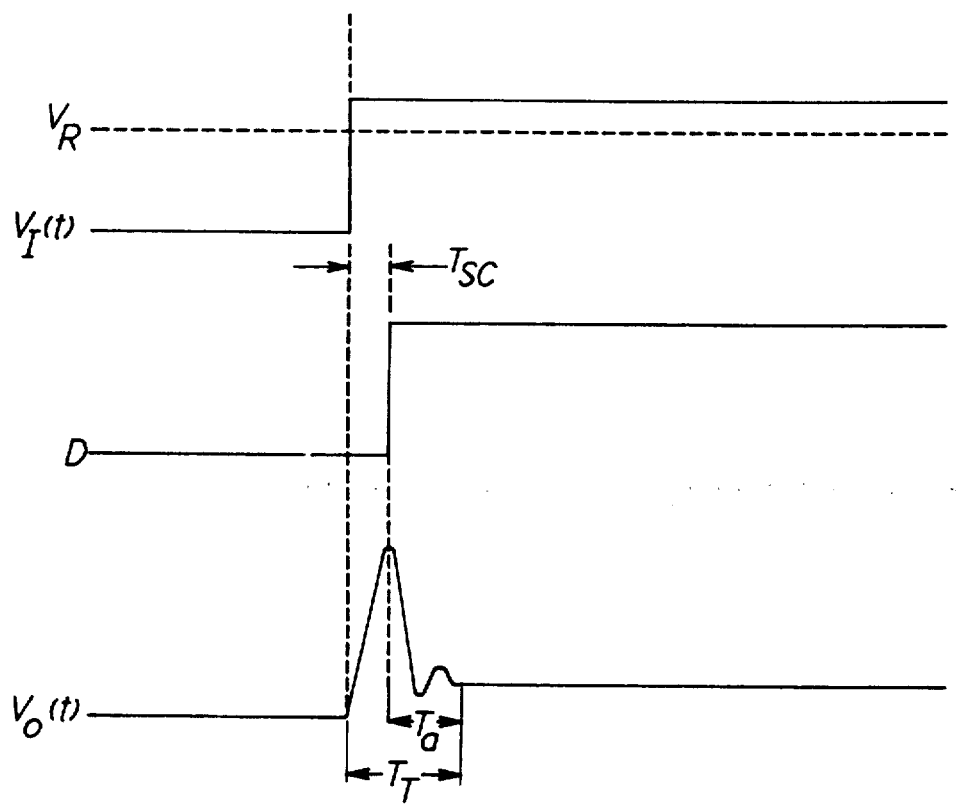
FIG. 2D is a conversion delay diagram for the SYMAD cells shown in FIGS. 2A and 2B.

FIG. 2D illustrates the conversion delay for the SYMAD cells of FIGS. 2A and 2B, wherein:

$V_R$ is the reference voltage;
$V_I(t)$ is the sampled analog input signal;
D is the digital output;
$V_O(t)$ is the output analog signal;
Tsc is the settling time of the comparator;
Tsw is the switching time;
Tso is the op-amp settling time;
Ta is the sum of Tsw and Tso; and
$T_T$ is the total delay from signal input to stable output.

For the SYMAD cell of FIG. 2C, $T_T$ is reduced to Tso, the op-amp settling time.

Figure 3:
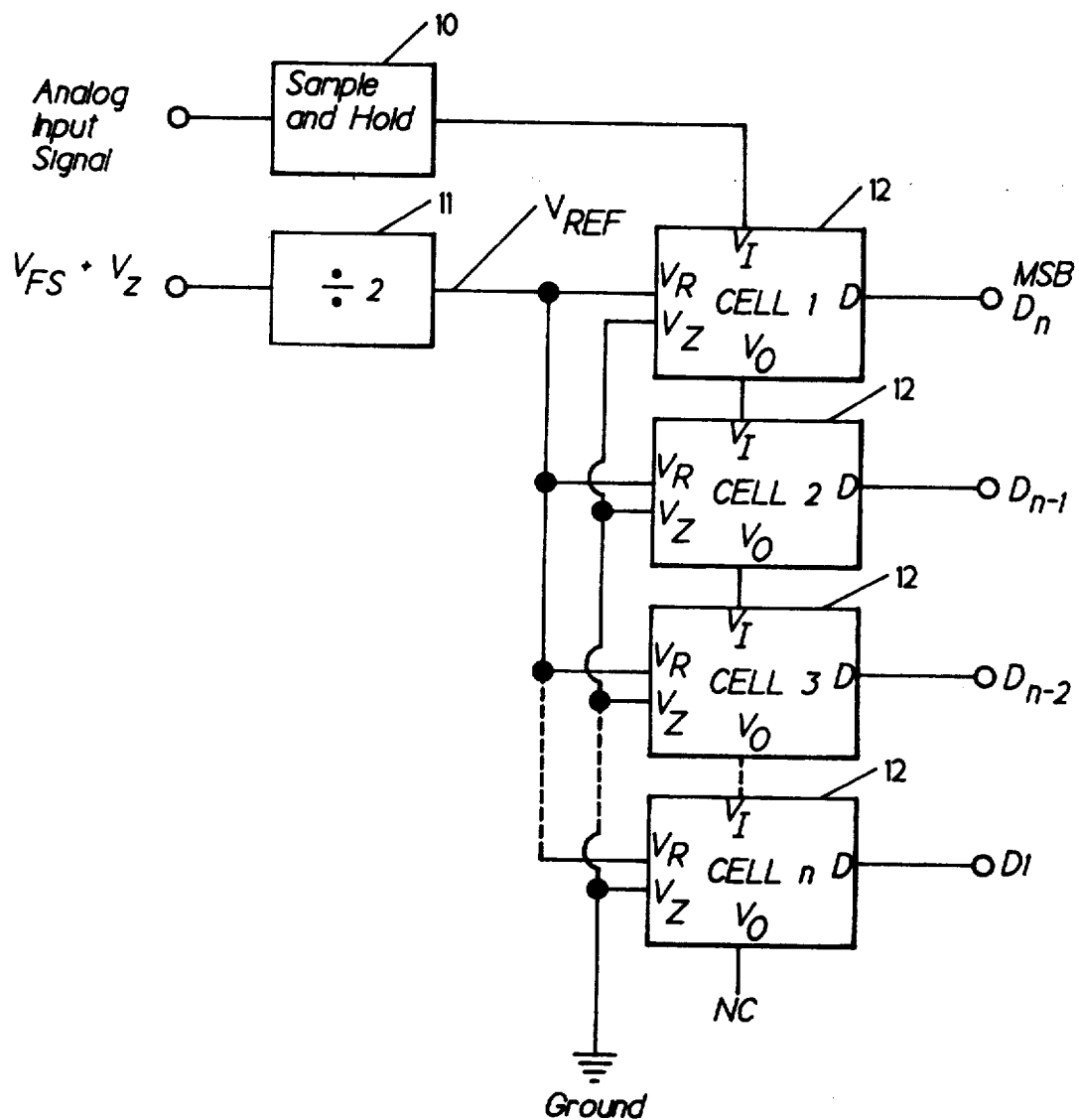
FIG. 3 is a block diagram of an n-bit analog to digital converter utilizing a plurality of SYMAD cells.

FIG. 3 illustrates an n-bit ADC utilizing a plurality of SYMAD cells. In this embodiment, the SYMAD cells 12 are depicted as CELL 1 to CELL(n). The analog input signal, after being processed by conventional sample and hold circuitry 10, is coupled to the analog input of a first SYMAD cell 12 (CELL 1). $V_R$, the reference signal input of the first SYMAD cell 12, is coupled to the output of the divide-by-two circuit 11. The output signal of the divide-by-two circuit is $V_{REF}$, which is expressed as $$V_{REF}=((V_{FS}+V_Z)/2),$$

where $V_{FS}$ is the full scale voltage, and $V_Z$ is the zero reference.

Since $V_{REF}$ is coupled to the $V_R$ terminal of SYMAD cell 12 $V_R=V_{REF}$. If $V_Z$ is coupled to ground, then is expressed as $$V_R=V_{REF}=V_{FS}/2$$

In FIG. 3, the zero reference $V_Z$ is coupled to ground.

The "D" output of the first SYMAD cell 12 is the most significant bit (MSB) of the digital output. The analog output of the first SYMAD cell 12 is coupled to the analog signal input of the second SYMAD cell 12 (CELL 2). SYMAD cells are serially connected in this manner to achieve the required number of bits of resolution.

For example, to achieve a resolution of eight bits, eight SYMAD cells 12 are employed. This configuration can be realized on one monolithic substrate, as illustrated in FIG. 15, thus avoiding the complexity of using discrete components. The conversion time for the configuration of FIG. 3 is a linear function of the number of output bits and is expressed as $$C_t=nTcd,$$

where n is the number of SYMAD cells and Tcd is the conversion delay, which is the sum of Tsc+Tsw+Tso.

If the SYMAD cell in FIG. 2C is utilized, then Tcd=$T_{SO}$.

Figure 4:
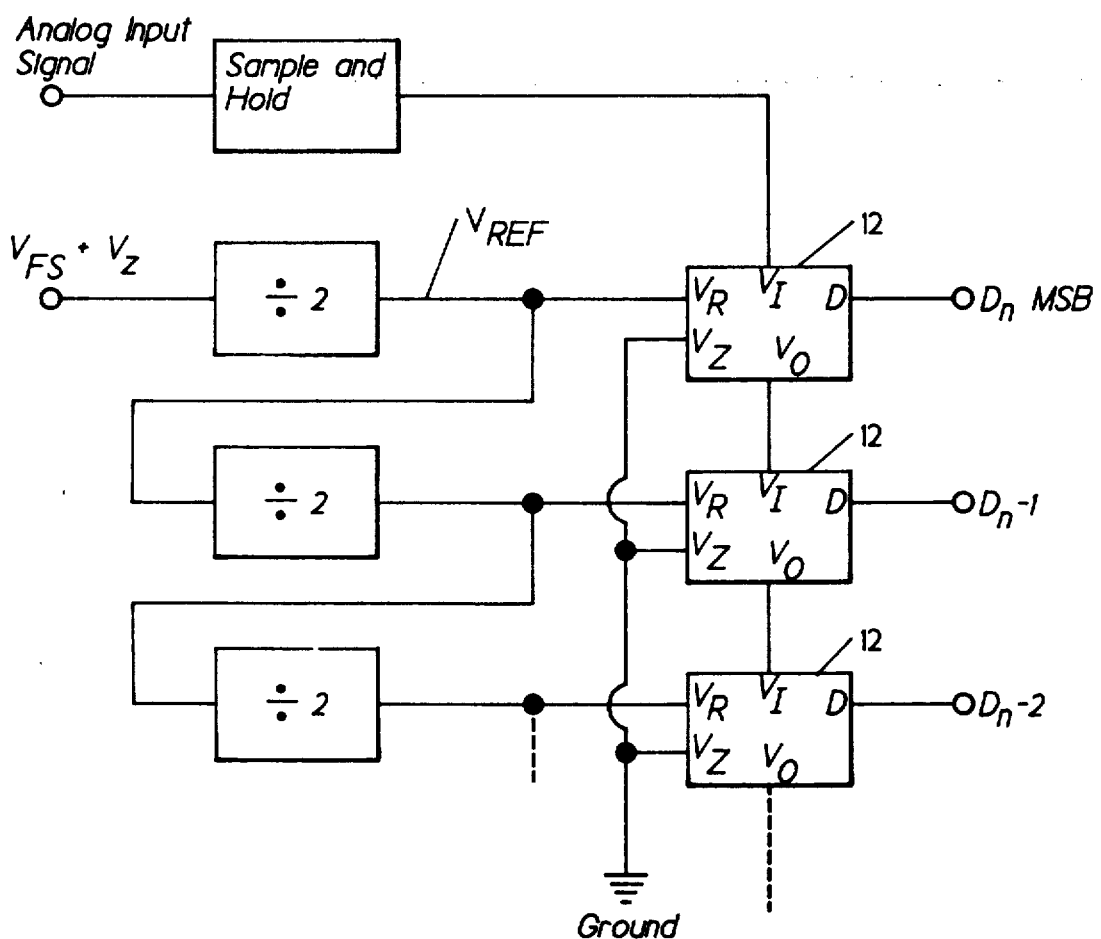
FIG. 4 is a block diagram of an n-bit analog to digital converter utilizing a plurality of SYMAD cells, each cell having a gain of one.

FIG. 4 illustrates an embodiment wherein a SYMAD cell 12 is utilized to construct an n-bit ADC, wherein the reference voltage is successively divided by two before being coupled to the next SYMAD stage. The zero reference $V_Z$ is coupled to ground. In this embodiment, the gain of the differential amplifier within the SYMAD cell is adjusted to unity to account for the successive division of the reference voltage. As many SYMAD cells as necessary are employed to achieve the desired resolution. Resistor networks are suitable for implementing the divide-by-two function of the reference voltage. Due to the divide-by-two networks, ADC realization is more complex than the configuration shown in FIG. 3, however, the conversion time for the FIG. 4 configuration is a logarithmic function of the number of output bits; and is thus faster than the conversion time for the FIG. 3 configuration. The equation governing the output voltage of each cell is $V_o=-V_I-d(V_R-V_Z)$.

Figure 5:
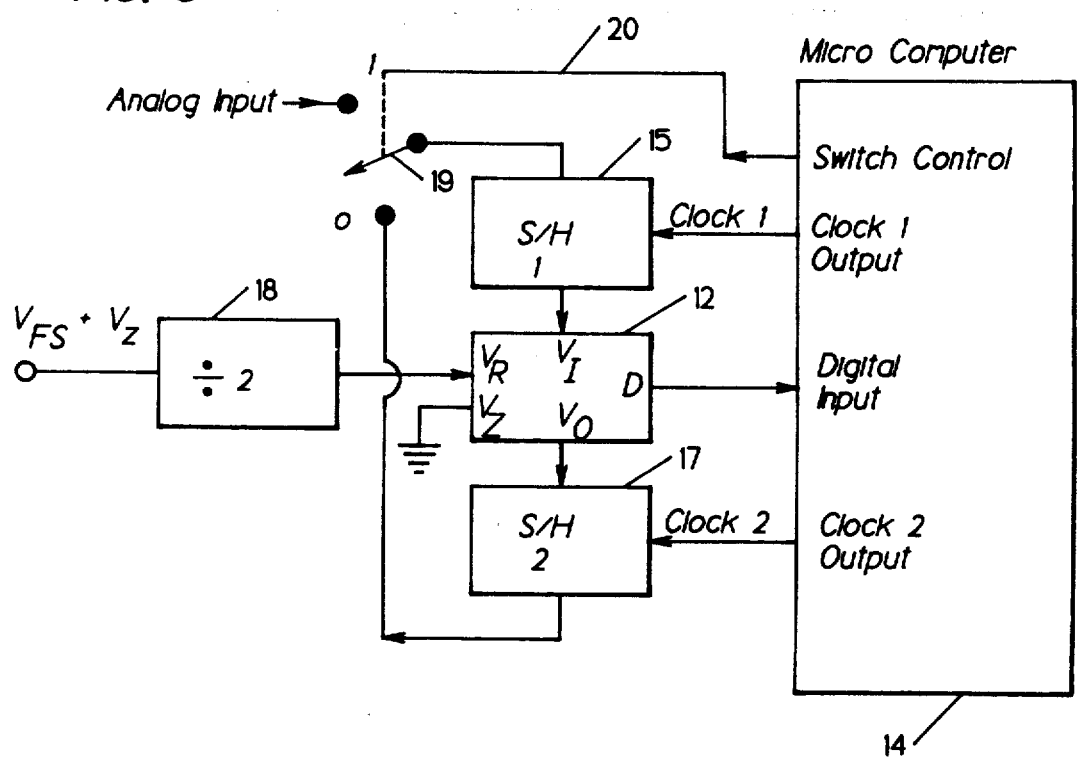
FIG. 5 is a block diagram of a cyclic analog to digital converter utilizing a single SYMAD cell.
Figure 6:
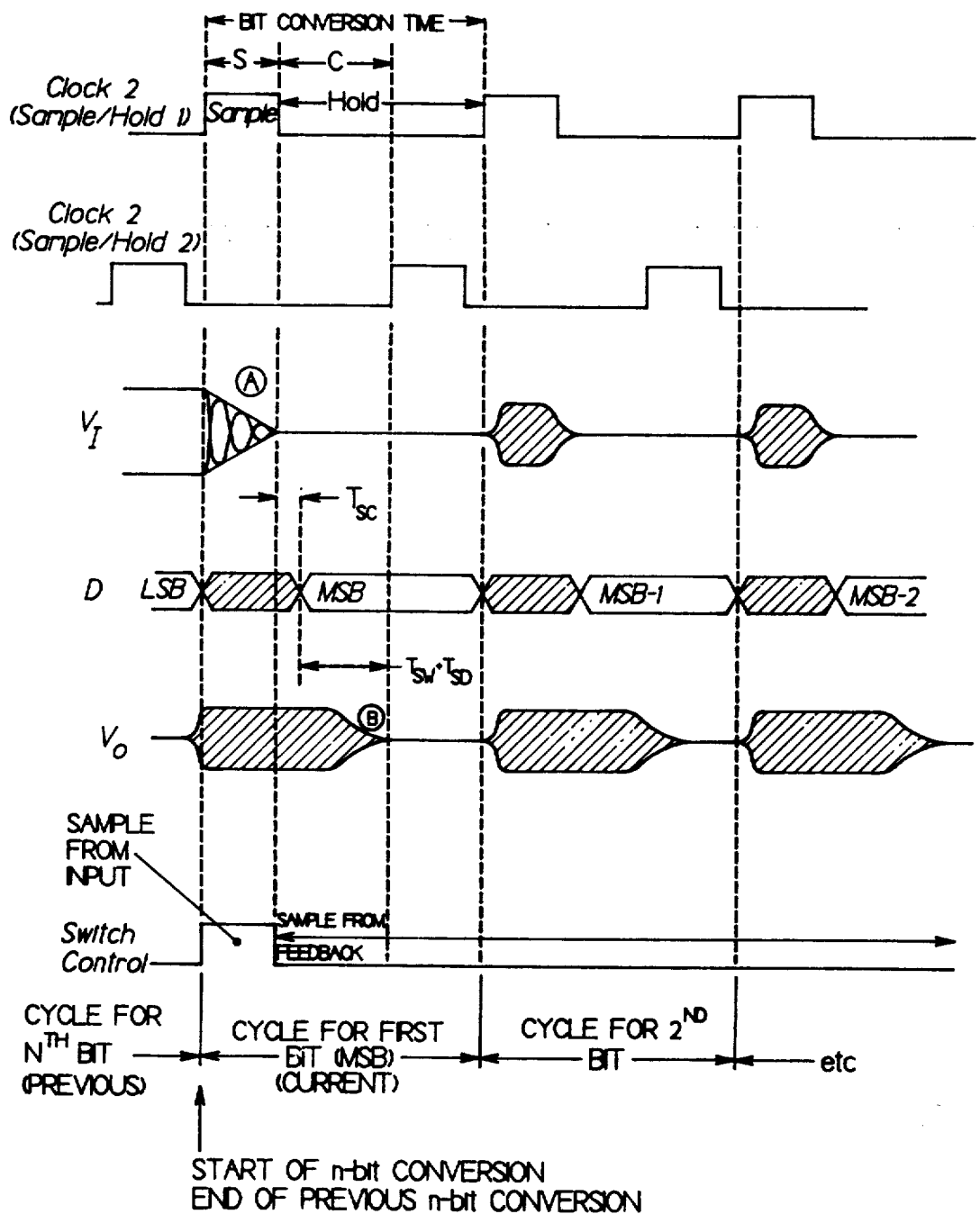
FIG. 6 is a timing diagram for the cyclic analog to digital converter shown in FIG. 5.

A Cyclic Analog to Digital Converter is illustrated in FIG. 5. The corresponding timing diagram for this configuration is shown in FIG. 6. In this embodiment a controller, such as a microcomputer 14, outputs a clock signal to a first sample and hold circuit 15. The output of the sample and hold 15 is coupled to the analog signal input terminal of the SYMAD cell 12. The reference signal $V_R$, of the SYMAD cell 12, is the sum of $V_{FS}+V_Z$ divided by two. The divide-by-two function is performed by the divide-by-two network 18. The zero reference $V_Z$ is coupled to ground, therefore $V_R=V_{FS}/2$. The "D" output of the SYMAD cell 12 is coupled to an input of the microcomputer 14. Upon the reception of this single bit from the "D" output port of the SYMAD cell 12, the microcomputer 14 emits a second clock pulse which is coupled to a second sample and hold circuit 17. The analog output of the SYMAD cell 12 is coupled to the input port of the second sample and hold circuit 17. The output of the sample and hold circuit 17 is coupled to one of the terminals of switch 19. The analog input signal is coupled to another input terminal of switch 19. The common terminal of switch 19 is coupled to the input of the first sample and hold circuit 15. The microcomputer 14 emits a switch control signal 20 that determines which signal, the output of sample and hold 17 or the analog input signal, is coupled into the input of sample and hold 15. The analog input signal is passed through the switch 19 to the input of the first sample and hold 15 at the beginning of the first conversion. The output of the second sample and hold 17 is passed through the switch 19 to the input of the first sample and hold 15 for successive conversions. This ADC configuration is very simple and, because of the low parts count, can be made extremely accurate. This ADC configuration is readily capable of performing 16 bit conversions or more. A sequencer, or any other device capable of producing the waveforms shown in FIG. 6, can be substituted for the microcomputer.

Referring to FIG. 6, the rising edge of clock 2 appears at a time $S + C$ after the rising edge of clock 1, where $S$ = settling time of a sample and hold circuit; and where $c$ = analog settling time of the SYMAD cell.

In FIG. 6, the analog input signal, after being processed by the sample and hold, settles at point A. Tsc is the comparator settling time, Tsw is the switching time, and Tso is the op-amp settling time. The analog output signal settles at point B. Tsc is the comparator settling time, Tsw is the switching time and Tso is the op-amp settling time.

Conversion times of one microsecond per bit or faster are achieved if high speed analog parts (operational amplifier and sample and hold) are utilized. Conversion times of one microsecond per bit enable the ADC to make 60,000 16-bit conversions per second. This conversion rate is suitable for use in compact disk recorders and other applications requiring high speed continuous conversions. Beneficially, this embodiment provides a high speed ADC that requires but a single cell. As a result, increased accuracy is obtained because of a reduction in the overall parts count relative to a comparable n-bit converter having n-cells.

During operation, microcomputer 14 accumulates the successive digital outputs for each conversion to any desired number of bits of resolution.

Figure 7A:
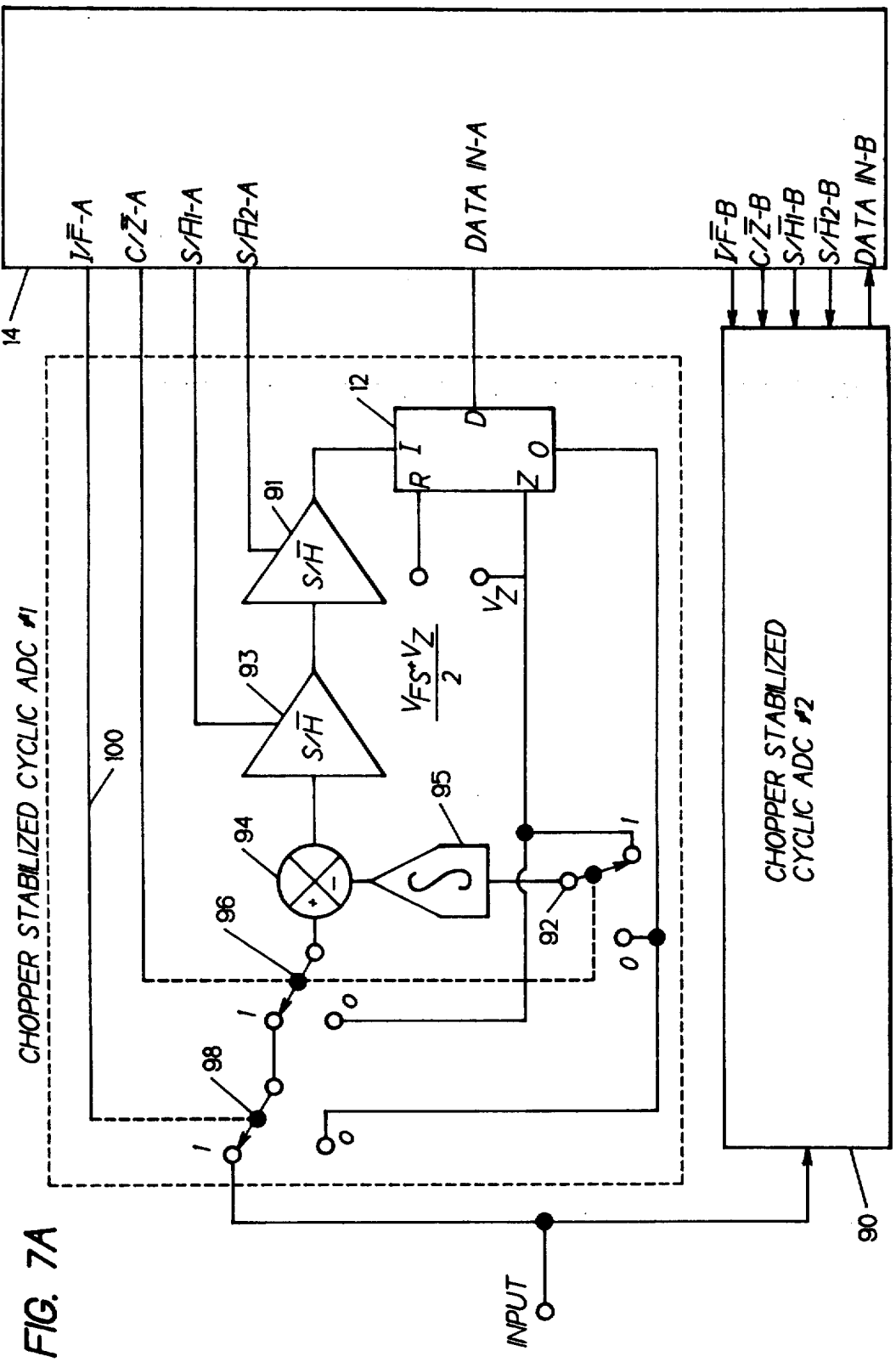
FIG. 7A is a block diagram of a chopper stabilized cyclic analog to digital converter.
Figure 7B:
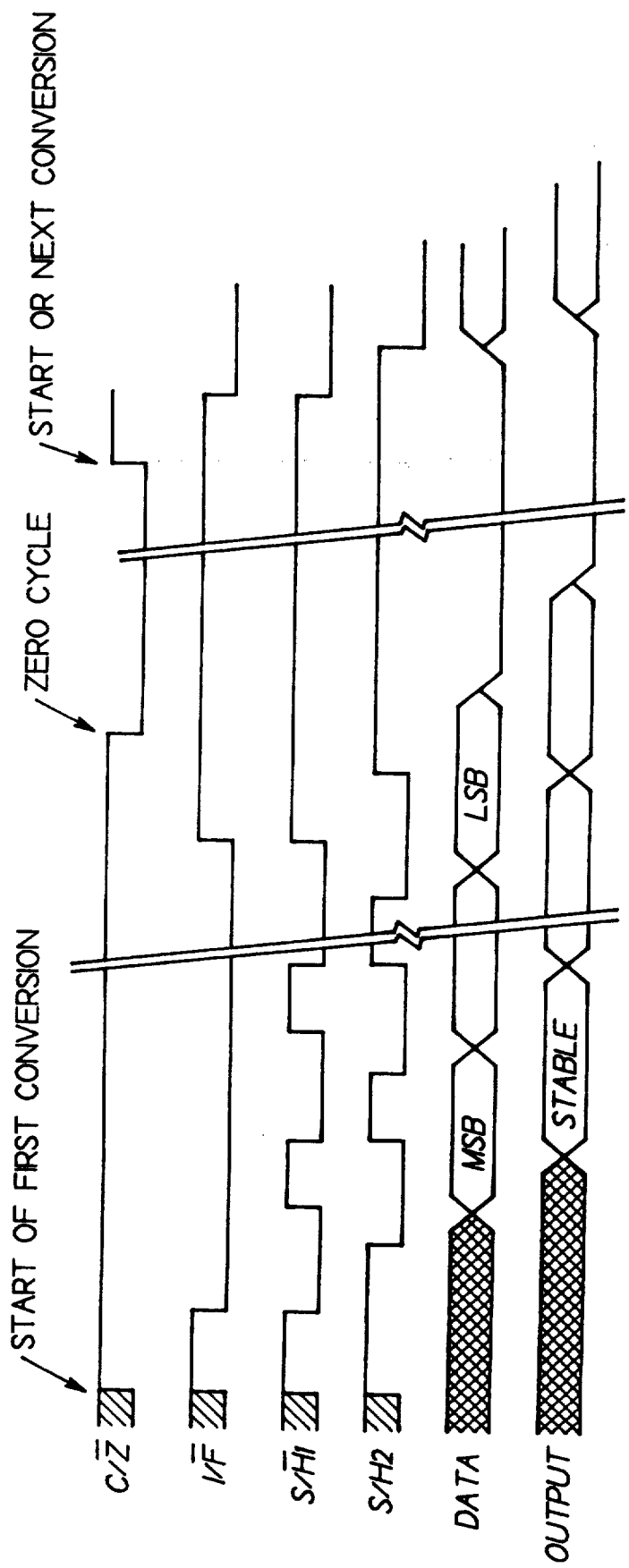
FIG. 7B is a timing diagram of the chopper stabilized cyclic ADC.

FIG. 7A illustrates a cyclic ADC employing chopper stabilization. Two chopper stabilized ADCs are used in such a manner that while one is converting a sampled analog signal into a digital output, the other ADC is in a zeroing mode. On a first clock pulse, an analog input signal is sampled, thus beginning the conversion process. For all remaining clock pulses, until the desired output bit resolution is achieved, the remaining conversions are made on the analog output signal from the SYMAD cell that is fed back into the circuit. In the conversion mode, one of the input terminals of SPDT switch 98 is coupled to the analog input signal. This is accomplished by microcomputer 14 emitting a logic one signal on Input/Feedback line 100. The analog input signal passes through Switch 98 and is coupled to an input terminal of SPDT switch 96. A logic one emitted by microcomputer 14 on the Convert/Zero line, which is coupled to the control terminal of switch 96, causes the analog signal to pass to the summing circuit 94. The summing circuit 94 subtracts an offset voltage, produced by the integrator 95, from the analog signal. The resulting signal is coupled to the input of sample and hold 93. The sampled analog signal at the output of sample and hold 93 is then coupled to the input of sample and hold 91. The output of sample and hold 91 is then coupled to the analog input of the SYMAD cell 12. The reference voltage $V_R$ applied to the SYMAD cell 12 is expressed as:

$$V_R = (V_{FS} + V_Z)/2,$$

where $V_Z$ is the zero reference voltage and $V_{FS}$ is the full scale voltage.

The zero reference $V_Z$ of SYMAD cell 12 may be coupled to ground. For this case, $V_R$ is expressed as:

$$V_R = V_{FS}/2.$$

The analog output of the SYMAD cell 12 is coupled to an input terminal of switch 92 and of switch 98. When the Input/Feedback line, which is coupled to the control terminal of switch 98, is a logic zero, the SYMAD cell 12 analog output signal is fed back into the ADC as an input and the external analog input signal is not used. The switch 98 now passes the SYMAD analog output signal to an input terminal of switch 96. Since the ADC is in the conversion mode, switch 96 passes the SYMAD analog output signal to the input of the summing circuit 94. The input to the integrator 95 is the zero reference, therefore the output of the integrator 95 is unchanged.

This mode of operation continues until the desired number of bits are accumulated for one conversion. At this time, the first chopper stabilized ADC is placed into the zeroing mode, designated by microcomputer 14 emitting a logic zero on the Convert/Zero line.

A logic zero on the Convert/Zero line causes switch 96 to pass the zero reference to the input of the summing circuit 94. Also, the second chopper stabilized ADC 12 enters the conversion mode.

Figure 7E:
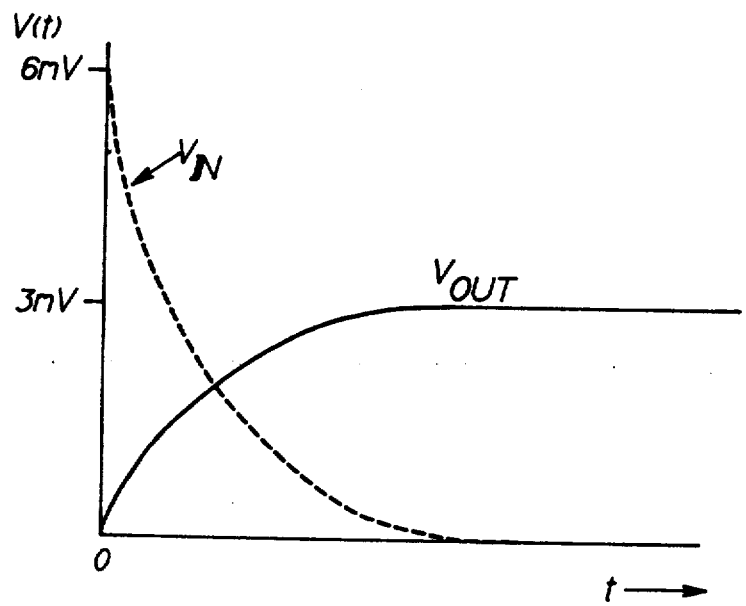
FIG. 7E is a diagram of the integrator input and output.
Figure 7C:
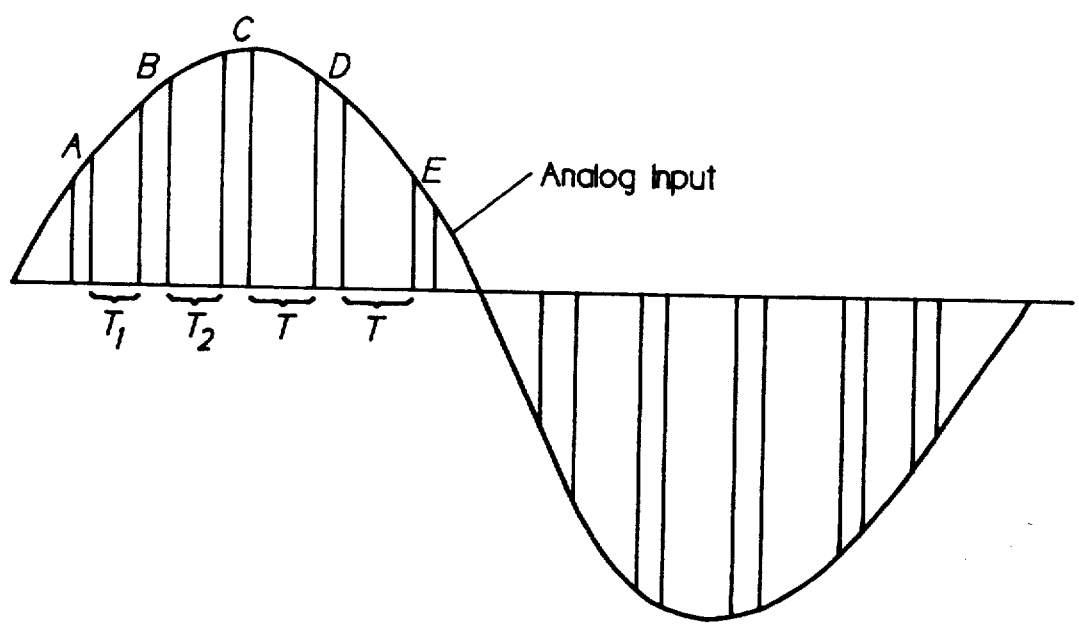
FIG. 7C is a diagram showing the occurrence of a conversion mode and a zeroing mode for each chopper stabilized cyclic ADC shown in FIG. 7A.

Referring to FIG. 7C, the first chopper stabilized ADC takes sample A, and at the end of period T1, during which time the ADC is in the feedback mode, it produces an n-bit conversion. Sample B is taken by the second chopper stabilized ADC while the first chopper stabilized ADC is in the zeroing mode (represented by a logic one signal on the Convert/Zero line).

The first chopper stabilized ADC produces sample C at the end of $T_2$, while the second chopper stabilized ADC is in the zeroing mode. When one of the chopper stabilized ADC's is in the zeroing mode, its digital output is ignored by the microcomputer.

Figure 7D:
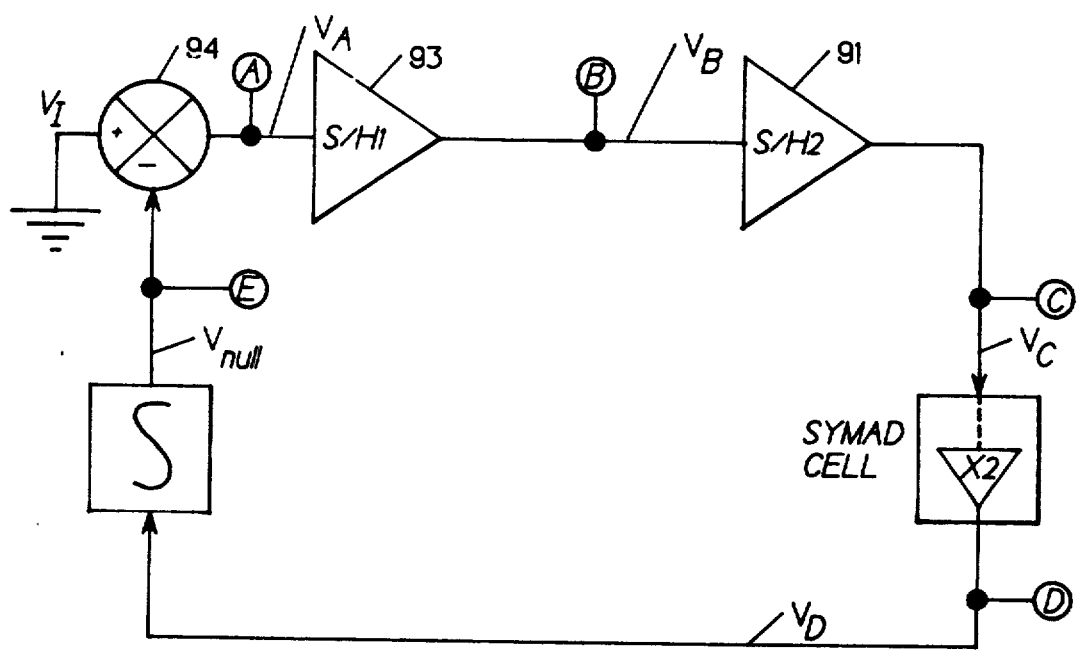
FIG. 7D illustrates the nulling function of the chopper stabilized cyclic ADC.

During the zeroing phase the microcomputer holds both sample and hold circuits in the sample state, and since all active components are in series, the ADC provides for the nulling of all offsets simultaneously. The integrator 95 performs a nulling function wherein the offsets produced by the summing networks, the sample and hold circuits, or the differential amplifier in the SYMAD cell are effectively nulled out by the integrator 95 output. The following example, wherein one millivolt offsets for each device are assumed, illustrates the nulling function shown in FIG. 7D. If a one millivolt offset, $V_{OF1}$, is produced by sample and hold 93, then at point B, which is the input to sample and hold 91, there appears a one millivolt signal. Sample and hold 91 also produces an offset voltage ($V_{OF2}$) at its output; therefore the signal at point C is expressed as $V_{OF2} + G V_{in}$, where G is the gain of the sample and hold 91, which is unity, and $V_{in}$ is the input signal to sample and hold 91, which is equal to $V_{OF1}$ ($V_I$ is coupled to ground, therefore $V_{in}$ is equal to the offset voltage of the preceding stage). The magnitude of the signal at point C in FIG. 7D is equal to $V_{OF1}+V_{OF2}$, or two millivolts.

The SYMAD cell 12 has a gain of two and also produces an offset voltage, $V_{OF3}$, of one millivolt. Therefore, the output of the SYMAD cell (point D) is expressed as $V_o=2(V_{in}+V_{OF3})$, where $V_{in}$ is the sum of $V_{OF1}$ and $V_{OF2}$. Thus, the magnitude of the error at point D is 6 mv.

This 6 mv signal is the input to the integrator 95. Referring to FIG. 7E, the output of the integrator 95 never reaches the input level because when an output of 3.0 mv is reached, all offsets are nulled out, resulting in a zero level signal at point D. In the conversion mode, the input to integrator 95 is zero. A zero input to an integrator will not change its output, therefore the integrator 95 is maintained at a 3.0 mv output.

A further improvement employs the zero/convert signal to electronically remove the feedback resistor of the SYMAD differential amplifier during the zeroing phase. This effectively magnifies, to saturation, the error signal to override any input offsets of the integrator. Thus, an inexpensive JFET amplifier, having a relatively high input offset, may be used to construct the integrator 95.

Figure 8:
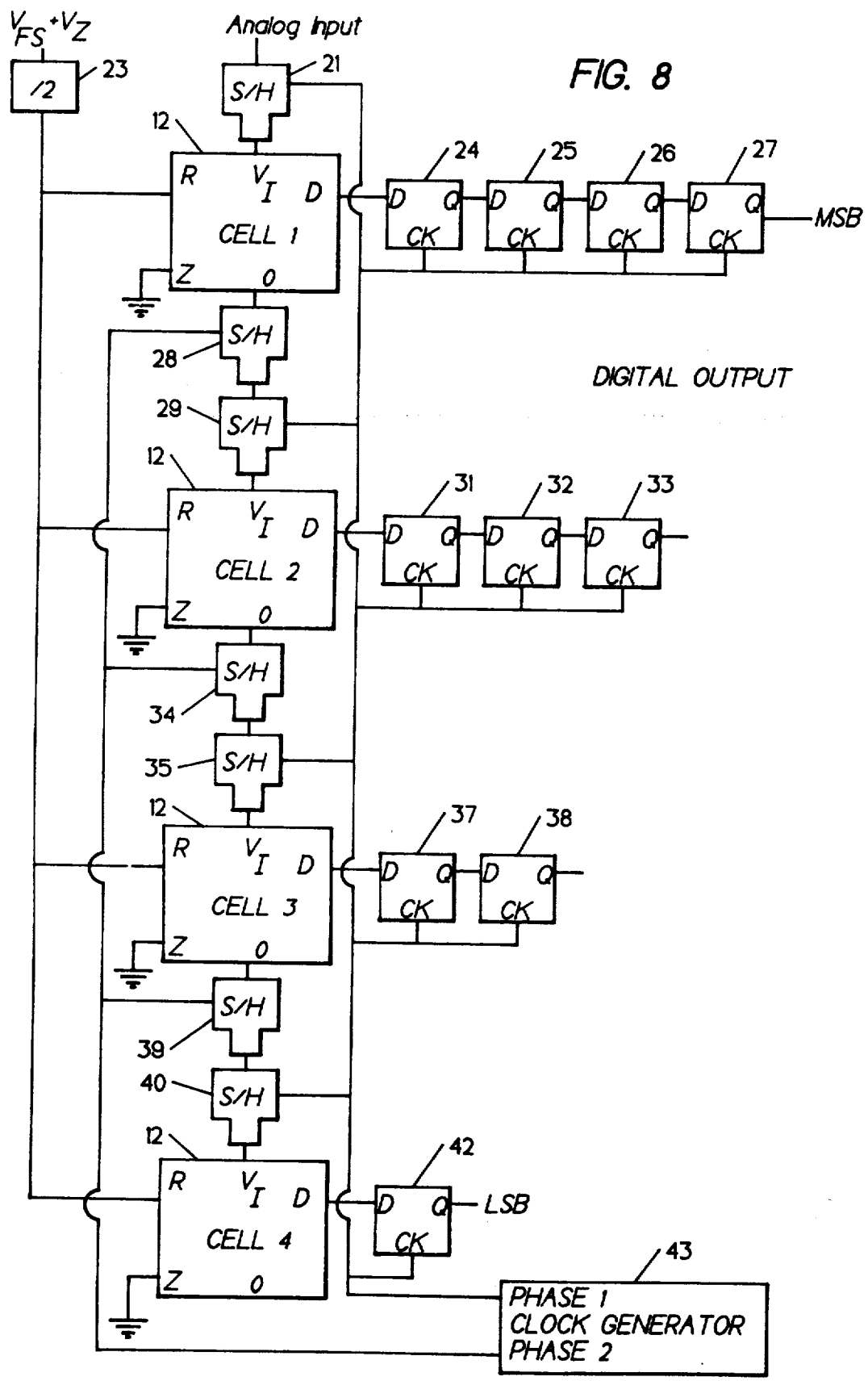
FIG. 8 is a block diagram of a pipelined analog to digital converter utilizing a plurality of SYMAD cells.

A further embodiment of the invention utilizes the SYMAD cell 12 in a Pipelined Analog to Digital Converter, as shown in FIG. 8. Between adjacent SYMAD cells 12, there are provided two sample and hold circuits, each being controlled by separate clocks produced by a clock generator 43. The sampled analog output of the first SYMAD cell 12 (CELL 1) is shifted by two sample and hold circuits 28 and 29 to the analog input signal terminal of the second SYMAD cell 12 (CELL 2). While the sampled analog signal is shifted by the sample and hold circuitry to the second SYMAD cell 12 (CELL 2), the first SYMAD cell 12 (CELL 1) receives the analog input signal from sample and hold 21. The edge-triggered clocked D-flip-flops 24–27, 31–33, 37, 38 and 42 each provide a one clock period delay such that the converted bits of a particular sample arrive at the digital outputs simultaneously. The pipelined analog to digital converter shown in FIG. 8 beneficially provides a rate of conversion that is constant, regardless of the number of bits being converted. That is, once the pipeline is filled, every clock pulse yields an n-bit digital output representing a prior sampling of the analog input signal. Furthermore, the configuration shown in FIG. 8 may be expanded with additional converter stages without degrading the conversion rate. The conversion rate may be expressed as one over the conversion period.

The conversion period is expressed as $(2(S)+C)$, where S is the settling time of a sample and hold circuit; and where C is the analog settling time of the SYMAD cell 12.

The pipelined analog to digital converter also includes an analog delay function. The analog delay through the pipelined ADC is expressed as Analog Conversion delay $= n(2s+c)$ FIGS. 9A through 9E illustrate the application of SYMAD cells to compression type converters, wherein compression is considered to be basically a logarithmic function. There are two major types of compression that are considered herein: $\log_2(x)$ and $\log_2(1+x)$, where "x" is the input signal and the base of the log function is 2. $\log_2(1+x)$ compression may be employed for the compression of audio signals for telephone systems and sound effect systems, in that it lends itself to the characteristics of the human ear. $\log_2(x)$ compression, as will be seen later, can be employed as part of a direct reading floating point ADC that meets the floating point representation used by processors, such as the National Semiconductor NS32081 floating point processor.

To aid the description of SYMAD compression cells several definitions are first established.

One of the most important definitions is that of a UNITY reference. This is intended to mean an analog voltage that represents unity, or the number 1. The value of UNITY is measured with respect to Vz, the zero reference. The next definition is that of a BASE reference. In that the base of the logarithmic conversion is two, base is defined to equal 2, or twice unity. It should be realized that in accordance with the foregoing that the same principles can be employed to create a compression converter of any base so desired.

First, $\log_2(x)$ compression is discussed, by an application of this technique to $\log_2(1+x)$ compression.

Logarithmic compression is best described in the context of binary floating point arithmetic. Given a binary integer that is to be converted to floating point (for example 0101111110), the integer is first written in the form:

$$0101111110.00000000 \times 2^{00000}.$$

The floating point rules discussed above require that the mantissa be between 1 (inclusive) and 2 (exclusive), thus the mantissa is shifted to the right enough times so that the most significant set bit is to the left of the binary point.

The shift right operation is equivalent to division by 2. However, in order to maintain the integrity of the magnitude, the exponent must be incremented by one for each rightward shift performed. Thus, the outcome is:

$$1.0111111 \times 2^{01000}.$$

For purposes of symmetry, values that are less than 1 may also be compressed by multiplying the mantissa (shifting left) and subtracting from the exponent.

The value 01000 (binary) is equal to the integer of the logarithm (to the base 2) of the original binary value given above. This exponent, by itself, is the desired output of a logarithmic compression ADC.

The above described technique lends itself to a cyclic conversion process, discussed below, in order to rapidly perform the logarithmic compression.

A set of mantissa multipliers are defined that are weighted to the bit positions of the exponent, such that a single SYMAD cell is assigned per exponent bit. For example, $$2^{00001}=2=\tfrac{1}{2}$$

$$2^{00010}=4=\tfrac{1}{4}$$

$$2^{00100}=16=1/16.$$

In accordance with the foregoing, to perform logarithmic compression there is defined a list of thresholds T(n), multipliers Q(n) and binary exponent equivalents B(n). Thus, the following table is presented:

| n  | T(n)  | Q(n)  | E(n) | B(n)  |
|----|-------|-------|------|-------|
| −5 | 1/256 | 512   | −9   | 10111 |
| −4 | 1/16  | 32    | −5   | 11011 |
| −3 | ½     | 8     | −3   | 11101 |
| −2 | ¼     | 4     | −2   | 11110 |
| −1 | 1     | 2     | −1   | 11111 |
| 1  | 2     | ½     | 1    | 00001 |
| 2  | 4     | ¼     | 2    | 00010 |
| 3  | 16    | 1/16  | 4    | 00100 |
| 4  | 256   | 1/256 | 8    | 01000 | where
 T(n) is a threshold value (the voltage reference used for compression is Vr(n)=UNITY*T(n) volts);
 Q(n) is the mantissa multiplier;
 E(n) is what is added to the exponent to offset the effect of the multiplier; $E(n)=\log_2[1/Q(n)]$;
 B(n) is the twos compliment equivalent to E(n); and
 n = the order of the output bit, where n = 1 is the LSB for a network of LD cells, and n = −1 is the LSB for a network of LM cells.

The table may be expanded by following the pattern shown. T(n) above the table line is a value that, when multiplied by Q(n), results in 2. T(n) below the line is a value that, when multiplied by Q(n), results in 1.

A description of the use of this Table is now provided.

Given an analog input voltage V and a 3-bit $\log_2(x)$ compression system:

| 1) | clear a result register; |
|----|---|
| 2) | if V > = T(3) then V: = V*Q(3) and add B(3) to result; |
| 3) | if V > = T(2) then V: = V*Q(2) and add B(2) to result; |
| 4) | if V > = T(1) then V: = V*Q(1) and add B(1) to result; |
| 5) | if V < T(−3) then V: = V*Q(−3) and add B(−3) to result; |
| 6) | if V < T(−2) then V: = V*Q(−2) and add B(−2) to result; |
| 7) | if V < T(−1) then V: = V*Q(−1) and add B(−1) to result; and |
| 8) | end. |

The final value of V may thus be applied to an ADC to obtain the mantissa, as described above, while the result register contains the exponent. The exponent may also be considered a INT($\log_2(V)$) compression on the input voltage.

Figure 9:
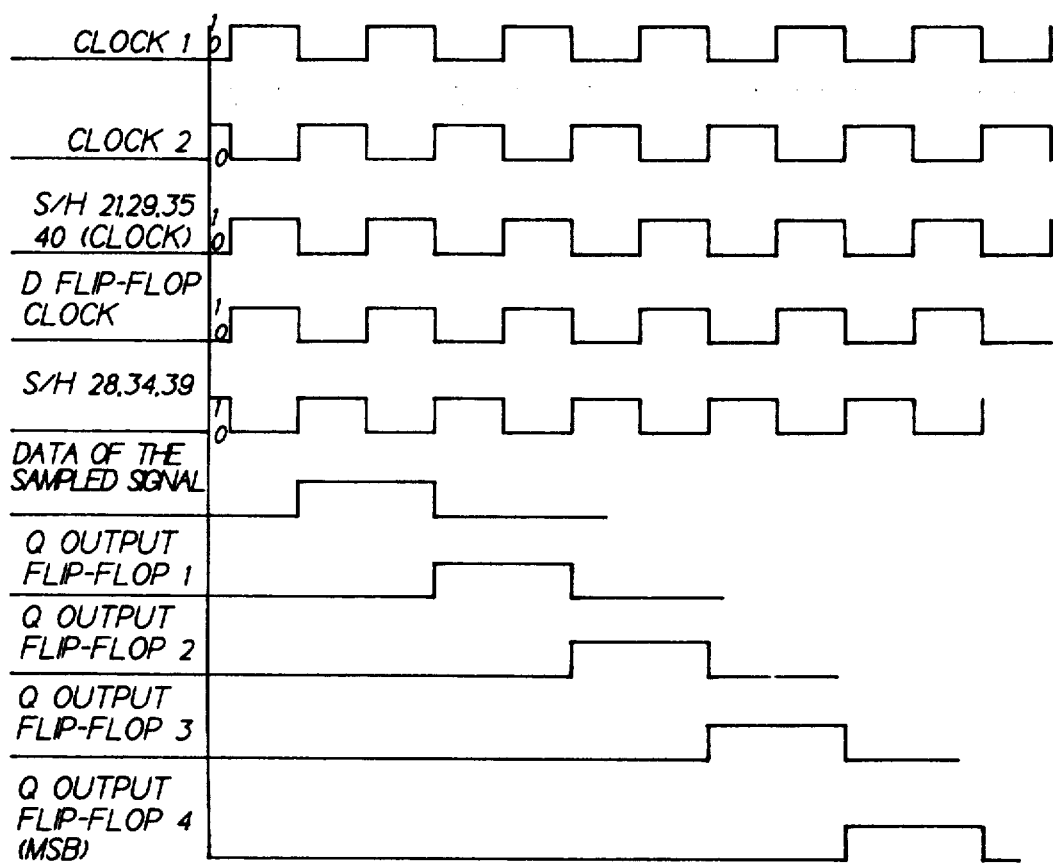
FIG. 9 is a timing diagram of the pipelined analog to digital converter.
Figure 9A:
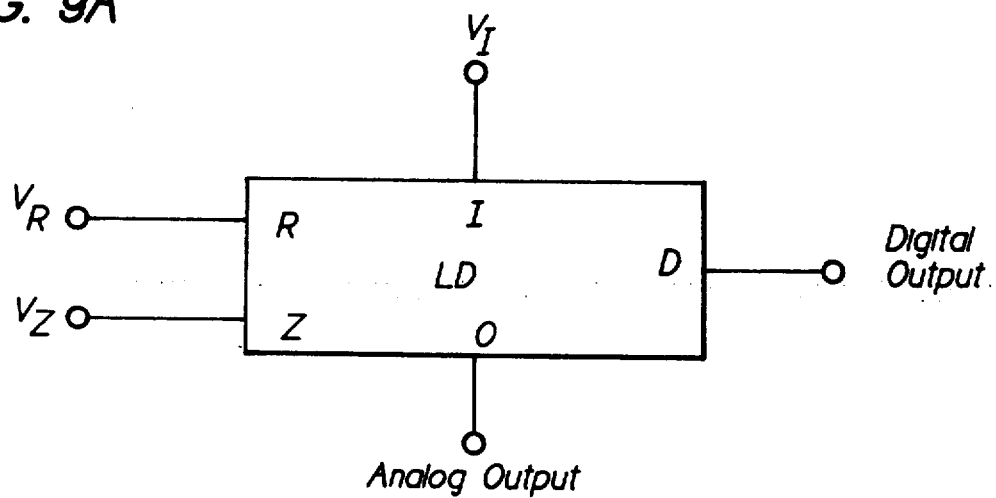
FIG. 9A is a block diagram of a $\log_2(x)$ dividing (LD) compression SYMAD cell.
Figure 9B:
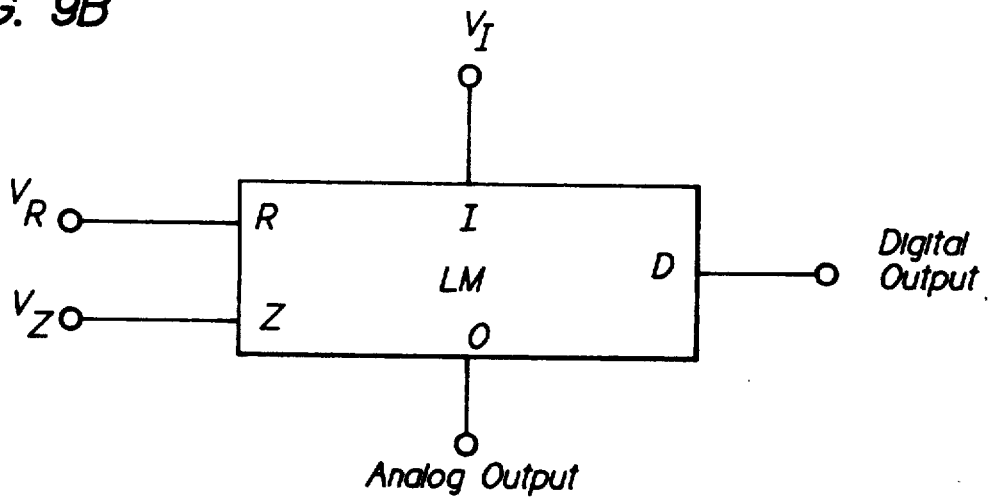
FIG. 9B is a block diagram of a $\log_2(x)$ multiplying (LM) compression SYMAD cell.

FIGS. 9A and 9B are block diagrams showing two basic cell types for producing straight logarithmic conversion. FIG. 9A shows cell with an "LD" designation. This cell is a logarithmic dividing cell; a cell used for compressing voltages greater than 2*UNITY. The cell designated as LM in FIG. 9B is a logarithmic multiplying cell; a cell used for compressing voltages less than UNITY.

The mathematical equations that govern the cells are:

LM type: $V_o=(1-d)*Vi*Q(n)+d*Vi$; and

LD type: $V_o=(1-d)*Vi+d*Vi*Q(n)$;

where d = 1 for D = logic high,
else d = 0.

Figure 9C:
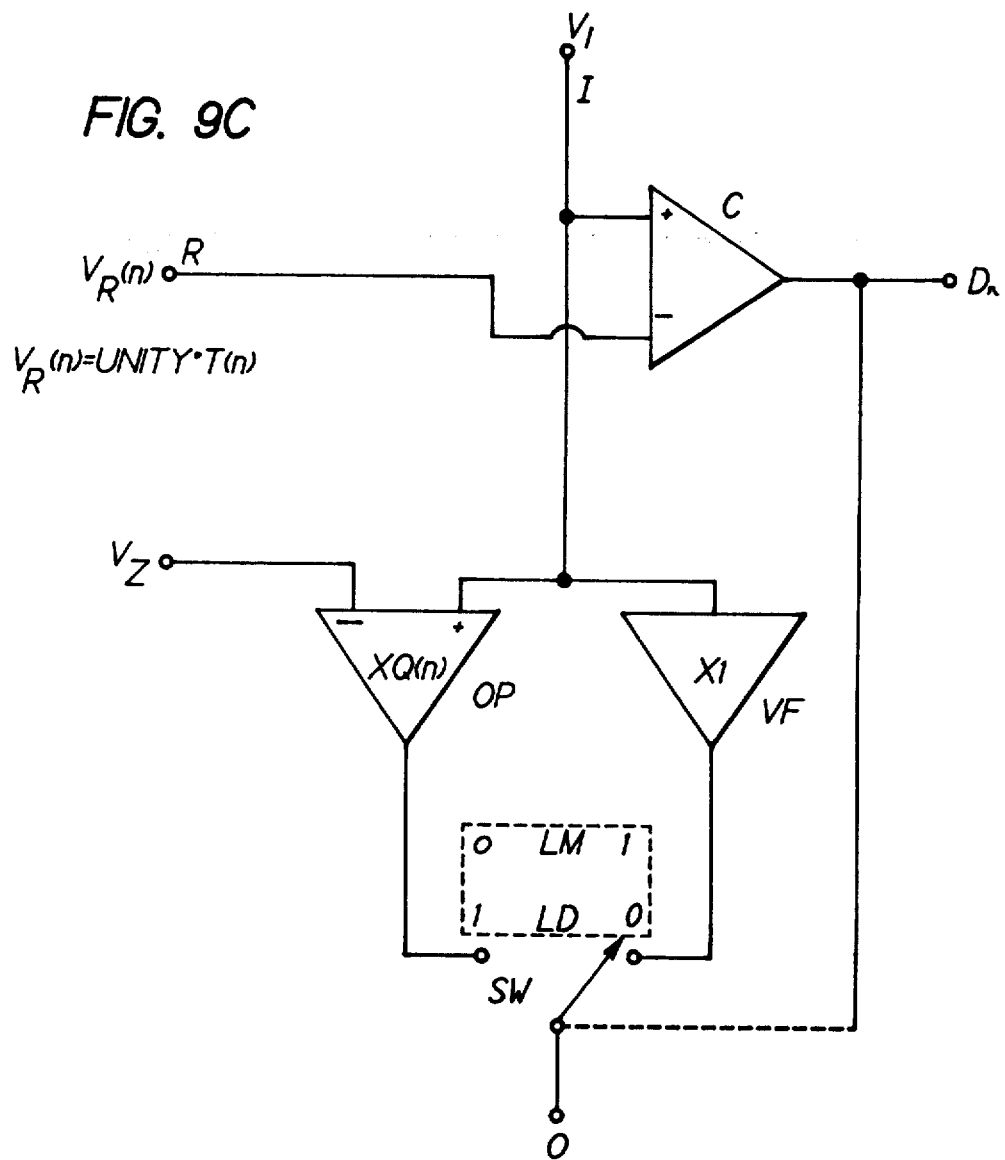
FIG. 9C is a block diagram of an embodiment of the LD and LM compression cells.

FIG. 9C shows a realization for both LM and LD type cells, the only difference between the two embodiments is the orientation of the switch (SW). As with other SYMAD cells described previously a comparator compares an input voltage Vi to a reference voltage Vr. If Vi is greater than Vr then a logic 1 appears at the D output. The D output is fed back to the control input of SW to select the analog output. There are two possible outputs that can be transmitted to the analog output, one being the input voltage through a voltage follower (VF), the other being output by op amp (OP) as a product of the input voltage with a constant that is a function of the order of the output bit that the particular cell represents. In the case of an LD type cell, the product path is selected when the "D" output is high, else the VF path is selected. In the case of the LM cell, the VF path is selected when the "D" output is high, else product path is selected. The reference voltage $V_R$ is also a function of the cell order and is a voltage equal to T(n)*UNITY. The zero reference ($V_Z$) is used to set operation in the bipolar mode. For simplicity, $V_Z$ is set to ground for description purposes.

Figure 9D:
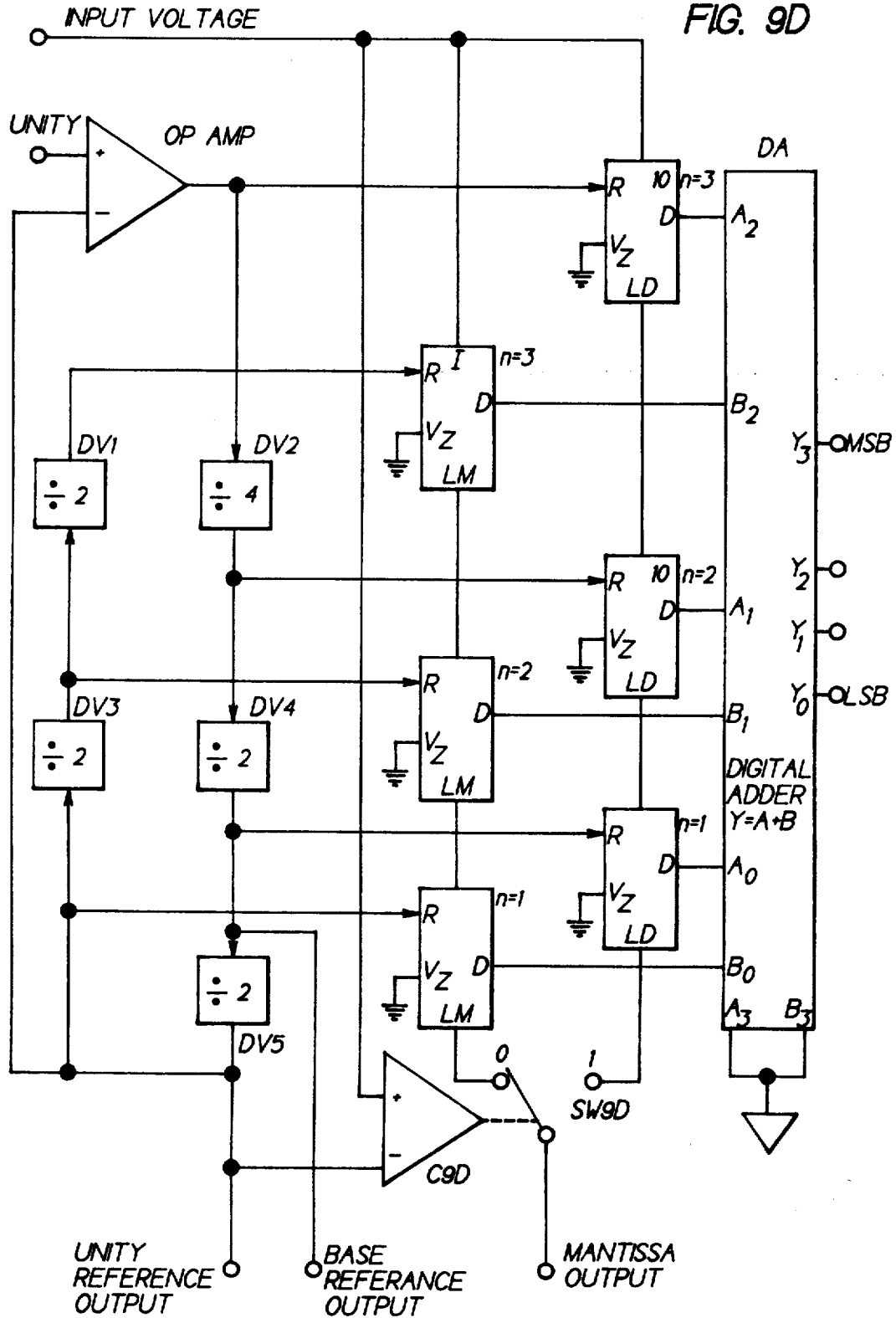
FIG. 9D is a block diagram of a four bit $\log_2(x)$ compression ADC.

FIG. 9D shows a $\log_2(x)$ compression ADC. This converter produces both positive and negative values, where a binary output of 0111 is zero, 1000 is 1 and 0110 is −1. The output can be converted to twos compliment by subtracting 0111 from the output, however, the representation as presented is consistent with the format in which floating point processors represent exponents. This converter can be constructed to n-bits by simply following the pattern illustrated. This diagram assumes that the input voltage is stable while converting.

Comparator C9D and switch SW9D select the appropriate mantissa source for the mantissa output. If the input voltage is less than unity the analog output of the LM of converter cells is selected. If the input voltage is greater than unity then the analog output from the LD chain of converter cells is selected for mantissa processing.

The voltage reference for the compression chains can be derived a number of ways, however the preferred method employs a low input offset op-amp OP9D and divider networks DV1-DV5. The output of the divider networks DV2, DV4 and DV5 generates the UNITY reference, which is the fed back to the inverting input of the OP9D. Thus the user need only specify what voltage will represent UNITY into the non-inverting input to the OP9D. The digital adder (DA) sums both the negative and positive components of the exponent to generate the composite exponent.

Figure 9E:
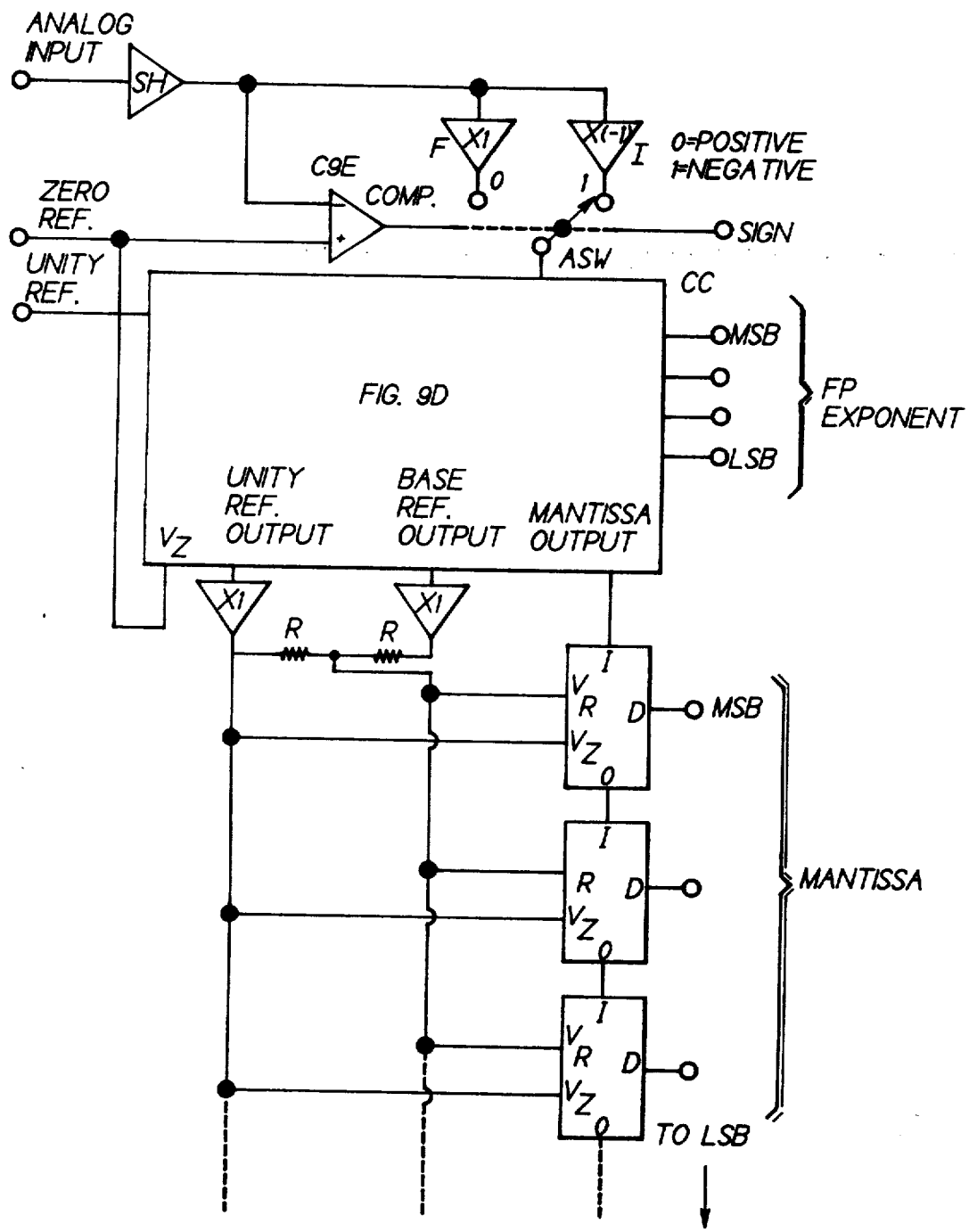
FIG. 9E is a block diagram showing the use of the $\log_2(x)$ compression in a direct reading, floating point ADC.

FIG. 9E illustrates an example of how the compression ADC of FIG. 9D may be employed to realize a direct reading, floating point analog to digital converter. An analog input signal is first processed by a sample and hold circuit (SH), then a comparator (C9E) determines if the input signal is positive or negative. The output of the comparator C9E is directly used as the mantissa sign, as well as being used to control an analog switch ASW to select either an inverter (I) or a follower (F) to rectify the signal to the $\log_2(x)$ compression converter (CC), as depicted in FIG. 9D. The digital output of the $\log_2(x)$ converter is used as the floating point exponent while the remaining outputs are connected to an external ADC to provide the mantissa data. The signals may be connected to a standard cell n-bit converter or a switched resistor n-bit ADC (of a type described below), however any ADC may be used for this purpose, wherein the UNITY reference output is the lower conversion limit and the BASE output is the upper conversion limit.

It should be noted the mantissa output includes only the fractional part of the mantissa. This is because the mantissa output of the compression converter normalizes the voltage between UNITY and BASE. Thus, there is an implied 1 to the left of the binary point. This is consistent with the floating point representation mentioned earlier.

Figure 9F:
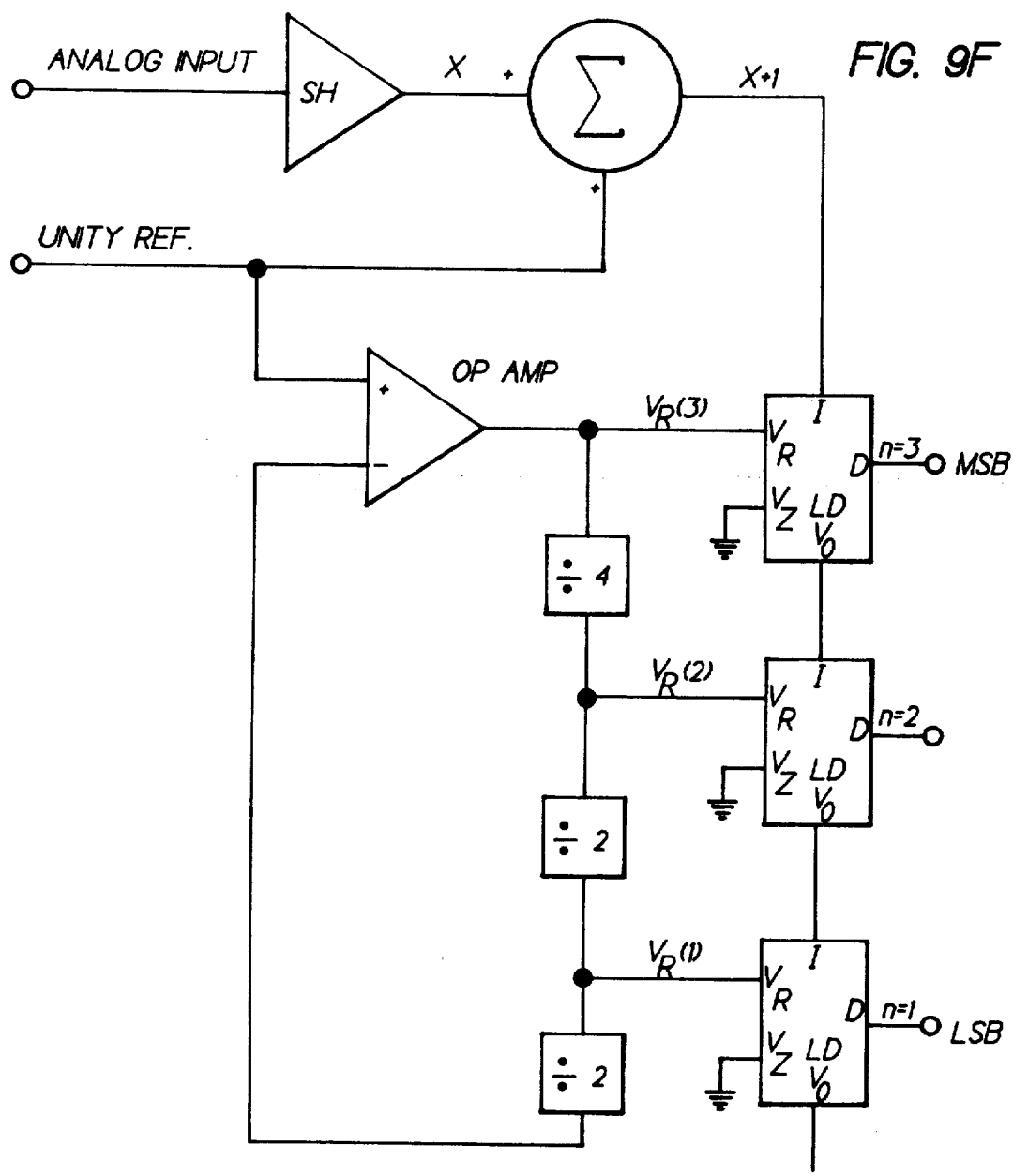
FIG. 9F is a block diagram of a $\log_2(1+X)$ compression A-D converter utilizing LD type cells.

FIG. 9F shows a $\log_2(1+x)$ compression analog to digital converter that is realized with LD type compression cells only. The $(1+x)$ feature is realized by adding the UNITY reference to the input signal of the first cell. The input voltage range of this converter is from ZERO to UNITY*$(2^{n+1})$-UNITY volts. The binary output of the converter is defined as:

binary output = INT[LOG$_2$(UNITY+Vi)], wherein the logarithmic function is to base 2.

Figure 9G:
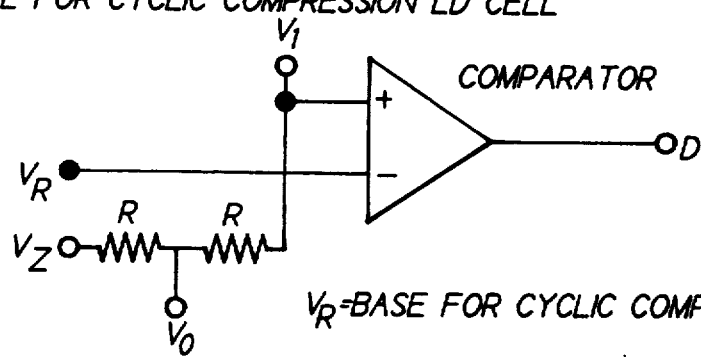
FIG. 9G is a schematic diagram of a compression cell optimized for cyclic compression.

Cyclic compression can be achieved by substituting the SYMAD cell of FIG. 5 with an LD(n=1) or LM(n=-1) type cell or with an optimized cell of the LD-type, as seen in FIG. 9G.

A cyclic LD expanding circuit is realized by substituting the SYMAD cell in FIG. 5 with a (X2) multiplier and connecting the input signal line to the UNIT voltage. The output of this expander is taken at the input to the (X2) network.

A cyclic LM expanding circuit is realized as above except that the (X2) multiplier is replaced with a divide by 2 network, such as two serially coupled resistors of the same value.

Figure 2E:
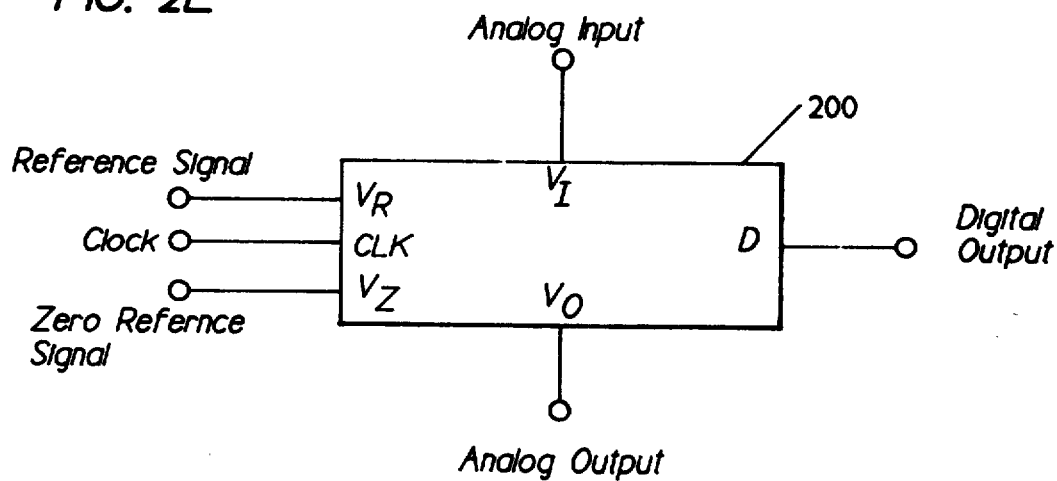
FIG. 2E is a block diagram of a synchronous SYMAD converter cell.

FIG. 2E shows a block diagram of a synchronous SYMAD converter cell 200 having a clock input. The synchronous SYMAD converter cell performs a sample and hold operation and a compare operation in parallel, as opposed to being performed in tandem, as is the case with the SYMAD converter cells shown in FIGS. 2A, 2B and 2C.

Figure 2F:
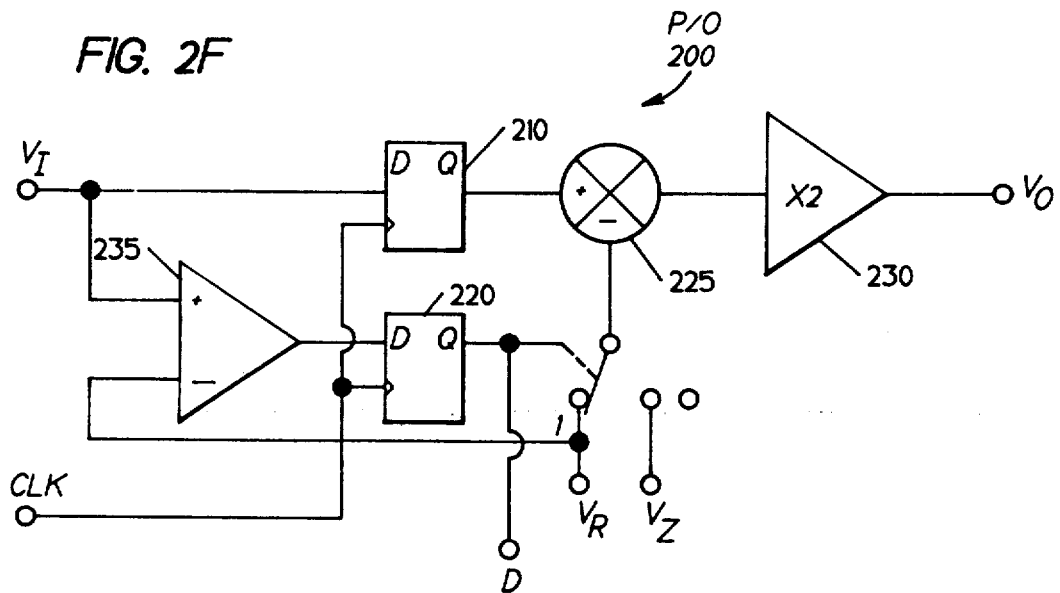
FIG. 2F is a block diagram of the internal circuitry of the synchronous SYMAD cell.

FIG. 2F shows in greater detail a synchronous SYMAD converter cell embodiment.

Figure 2H:
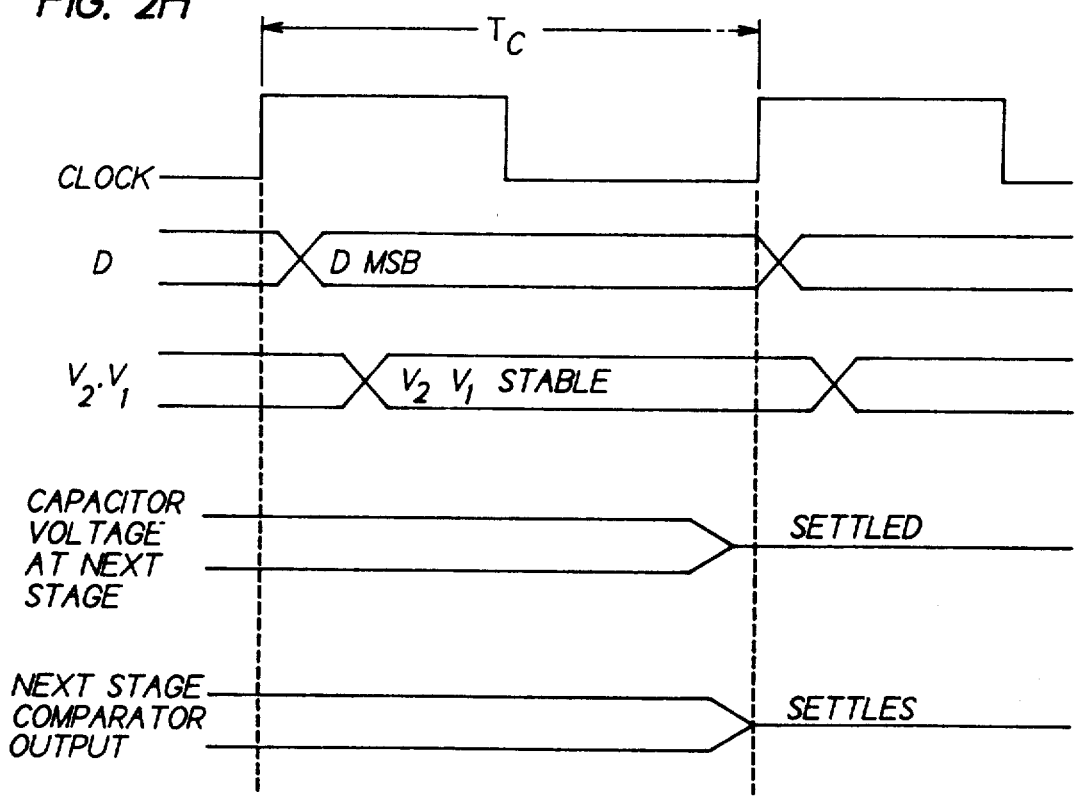
FIG. 2H is a timing diagram of the synchronous SYMAD cell.
Figure 2G:
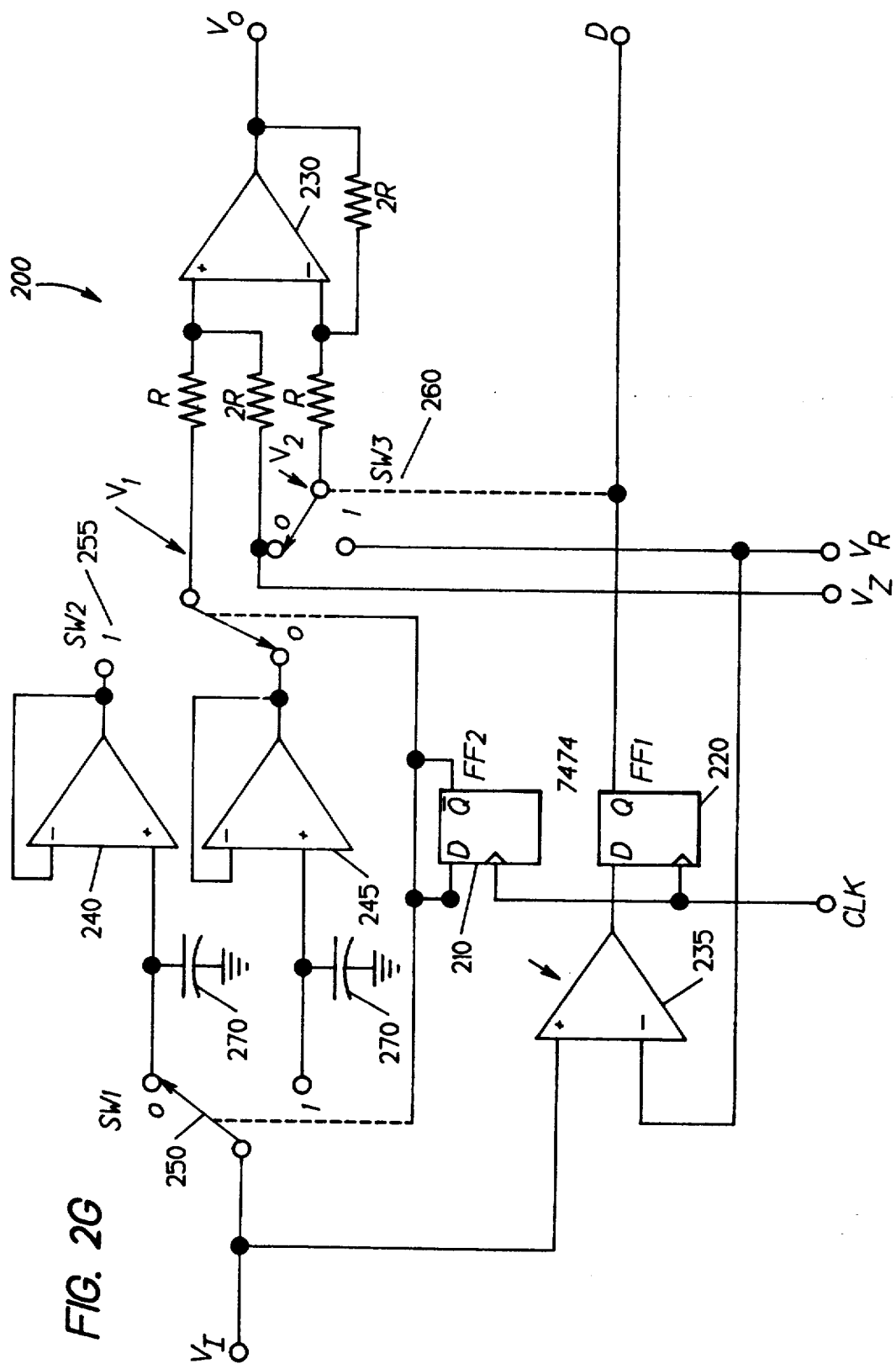
FIG. 2G is a detailed schematic of an embodiment of a synchronous SYMAD converter cell.

Referring now to FIG. 2G, JFET voltage followers 240 and 245, switch 250, switch 255 and D-flip-flop 210 form an edge triggered analog sample and hold. Switch 250 and switch 255 operate out of phase, permitting one JFET voltage follower to sample the analog input signal while the other JFET voltage follower holds its output constant. A rising edge from the clock signal toggles flip-flop 210, thus toggling the function of the JFET voltage followers. The compare operation is performed before the sample and hold operation, thus removing the effect of the compare function propagation delay.

Flip-flop 220 performs two functions: (1) to synchronize the arrival of the digital output signal "D" to the sampled analog signal at the input to the operational amplifier 230, and (2) to remove any instability of the comparator 235 output that may exist when the analog input signal and the reference signal have equal magnitudes.

Capacitors 270 are preferably of the low leakage mylar type. The operational amplifier 230 is a high speed device, preferably with a JFET inputs.

FIG. 2H shows a timing diagram of a synchronous SYMAD cell. The clock period Tc equals the time required for a comparator and sampling capacitor of a succeeding stage to settle after a rising edge of the clock. The comparator 235 output, the digital signal "D", is delayed only by the propagation delay of flip-flop 220.

Figure 2I:
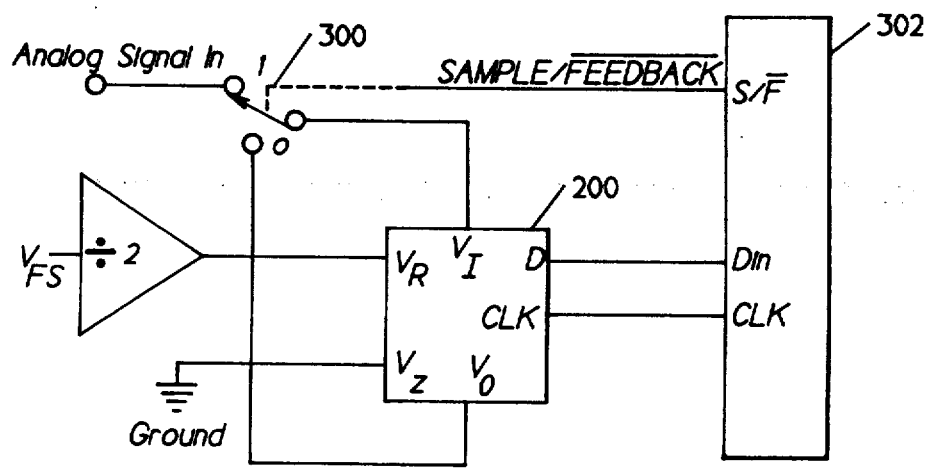
FIG. 2I is a block diagram of a cyclic ADC utilizing a synchronous SYMAD cell.
Figure 2J:
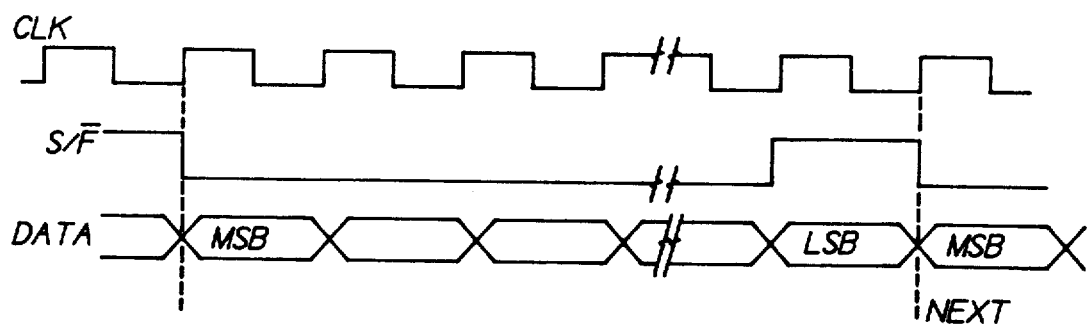
FIG. 2J is a timing diagram of a cyclic ADC utilizing a synchronous SYMAD converter cell.

FIG. 2I shows a cyclic ADC utilizing a single synchronous SYMAD cell and FIG. 2J shows the corresponding timing diagram. This cyclic ADC does not require a sample and hold on the input, unlike the embodiment shown in FIG. 5.

A logic one on the Sample/Feedback line causes switch 300 to pass the analog input signal to the input terminal of the synchronous SYMAD cell. A logic zero on the Sample/Feedback line causes switch 300 to couple the analog output of the synchronous SYMAD cell back to the input of the cell, thus creating a feedback loop. The zero reference of the cell is preferably coupled to ground. The conversion time for this cyclic ADC is faster than that shown in FIG. 5 because the synchronous SYMAD cell cyclic ADC's sample and hold operation and compare operation are performed in parallel, rather than sequentially.

A controller, such as microcomputer 302, outputs the Sample/Feedback waveform, outputs the synchronous SYMAD converter cell 200 clock waveform and receives the cell's digital output signals.

Figure 2K:
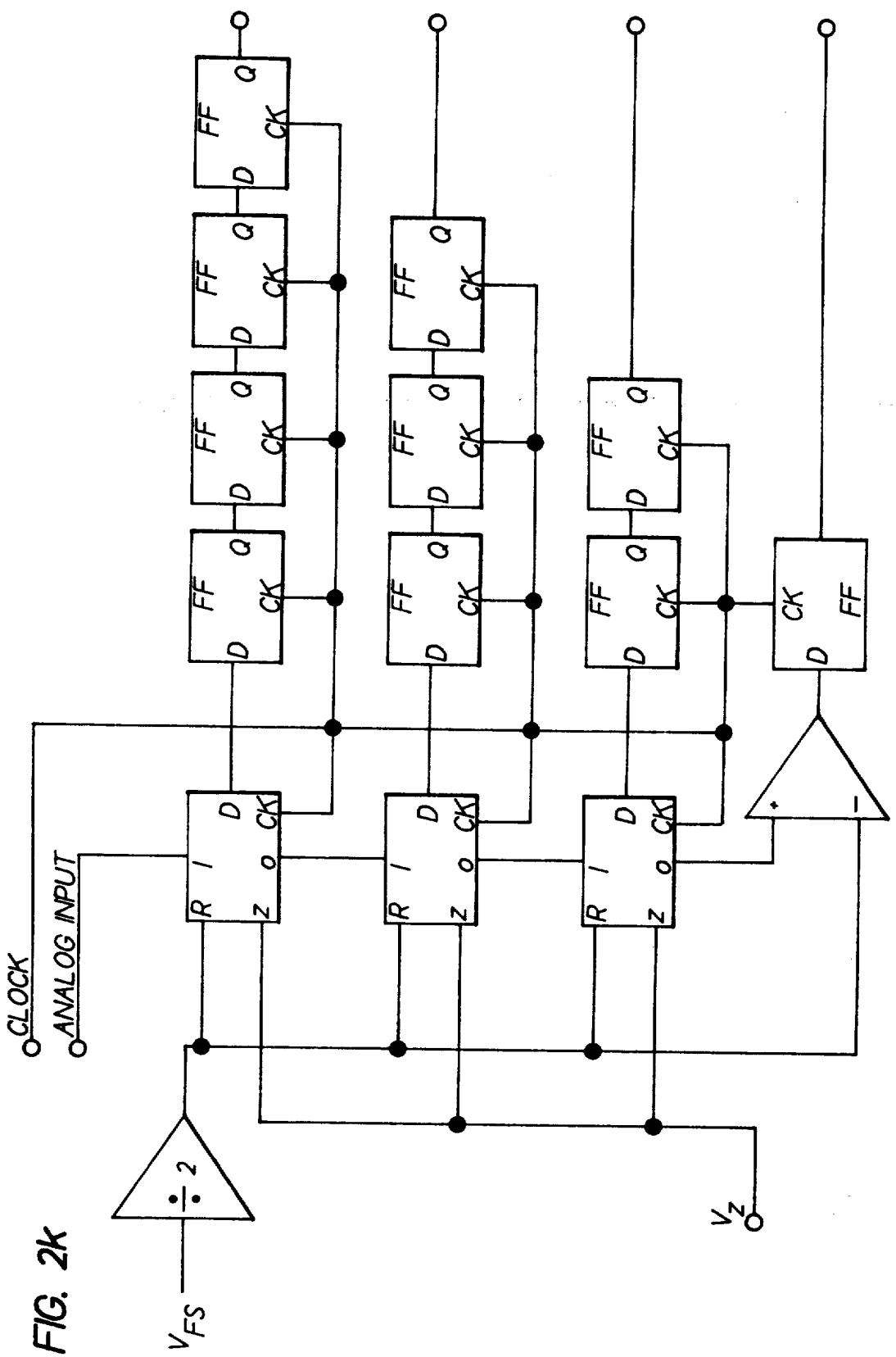
FIG. 2K is a block diagram of an n-bit pipelined ADC utilizing synchronous SYMAD cells.

FIG. 2K shows a pipelined ADC utilizing a plurality of synchronous SYMAD converter cells. No sample and hold circuit is required at the analog input because each synchronous SYMAD cell includes a sample and hold function. Therefore, the sample and hold circuits between the cells may also be omitted. The last stage, or LSB, can be realized with only a comparator. All flip-flops are triggered on the clock's rising edge. Since the sample and hold operation and the compare operation of each cell are performed in parallel, rather than sequentially, the conversion time is faster than the pipelined ADC shown in FIG. 8.

Figure 10A:
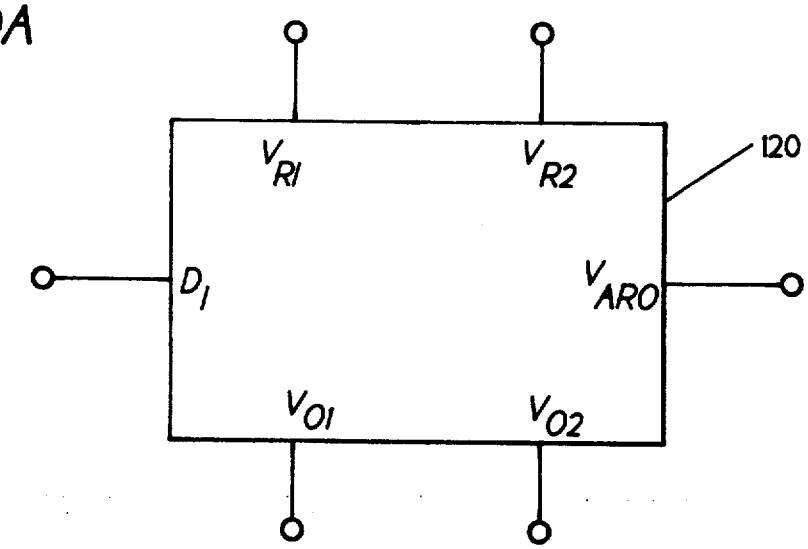
FIG. 10A is a block diagram of a switched resistor SYMAD converter cell.
Figure 10B:
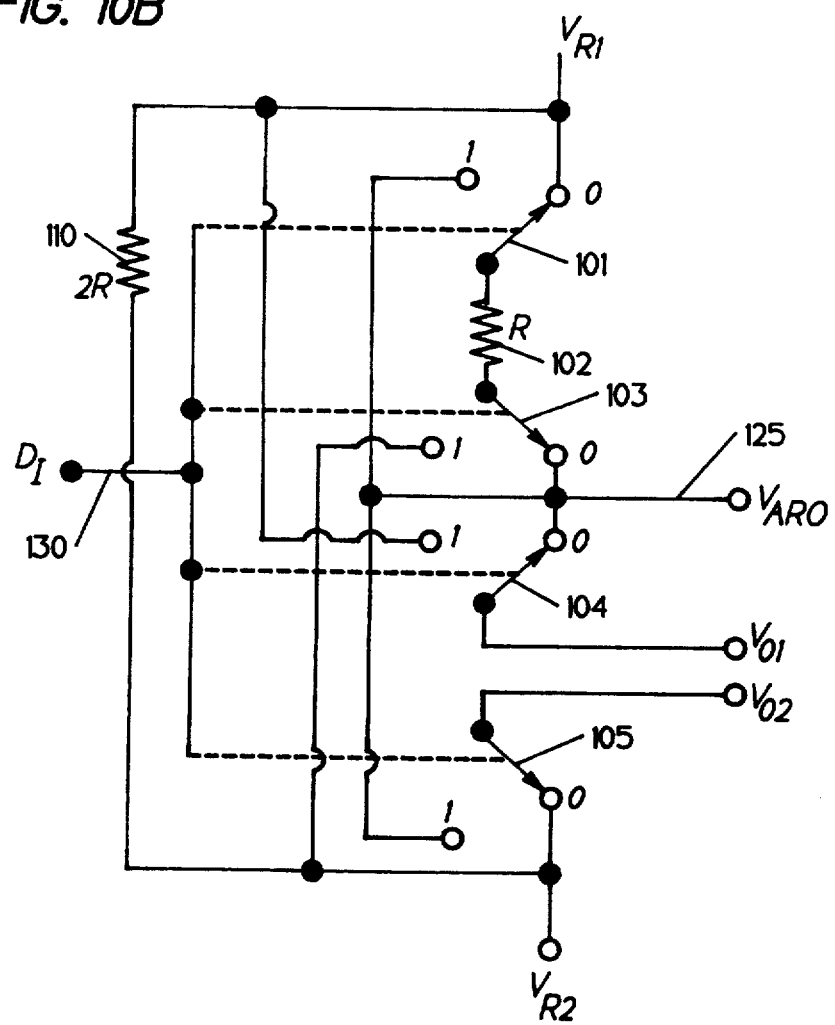
FIG. 10B is a detailed schematic of a switched resistor SYMA converter cell.

Another embodiment of the invention is a switched resistor SYMAD (SRSYMAD) cell shown in FIGS. 10A and 10B. One advantage of this embodiment is that the resistor network can be used in performing either an ADC function or a DAC function. Other applications of this embodiment include a digitally controlled analog attenuator and a digitally controlled potentiometer.

The chart below defines the SRSYMAD cell input and output signals.

| SIGNAL NAME | DESCRIPTION | INPUT/OUTPUT |
|---|---|---|
| VR1 | Positive Reference | Input |
| VR2 | Negative Reference | Input |
| D$_I$ | Digital Signal | Input |
| Vo1 | Positive Reference | Output |
| Vo2 | Negative Reference | Output |
| V$_{ARO}$ | Analog Reference | Output |

Figure 10C:
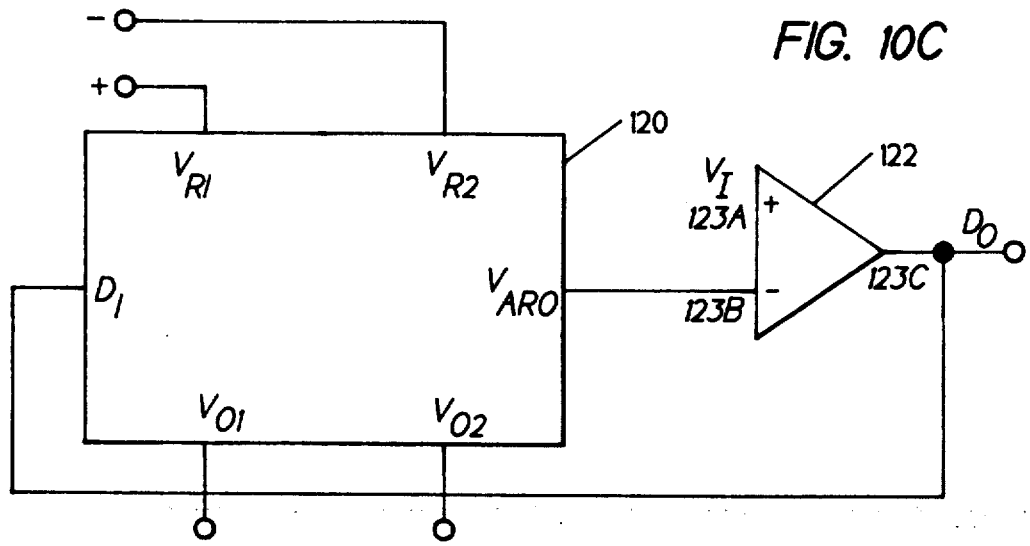
FIG. 10C illustrates the use of a switched resistor SYMAD converter cell in realizing an ADC cell.

Referring now to FIG. 10C, an ADC function is realized by connecting a comparator 122 in such a way that the V$_{ARO}$ signal is coupled to the inverting terminal (−) 123b of comparator 122 and the analog input signal is coupled to the non-inverting terminal (+) 123a of comparator 122.

When the analog input signal V$_I$ is greater than the analog reference signal V$_{ARO}$, the comparator 122 outputs a logic one. If the analog input signal V$_I$ is less than the analog reference V$_{ARO}$, the comparator 122 outputs logic zero.

Figure 10D:
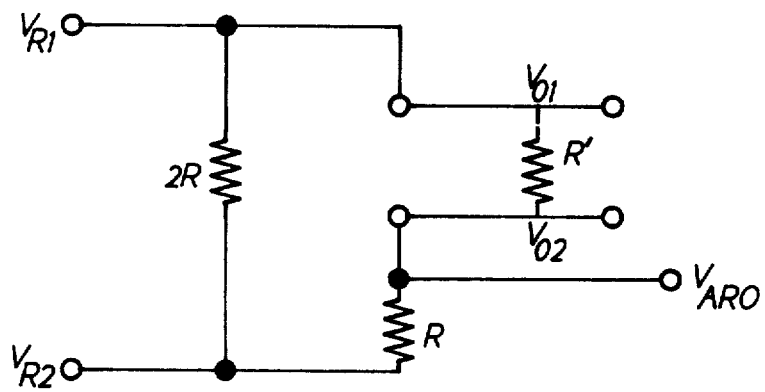
FIG. 10D illustrates the switched resistor SYMAD converter cell configuration with a logic one applied at the $D_I$ terminal.

The comparator 122 output 123c is coupled to the D$_I$ terminal of the switched resistor cell, as shown in FIG. 10c. When a logic one signal is received at the D$_I$ terminal, the switches are activated such that the cell configures itself as shown in FIG. 10D. R' is the resistance looking into the $V_{R1}$, $V_{R2}$ terminals of the next switched resistor SYMAD cell. The analog switches swap resistor R and the output terminals Vo1 and Vo2, while maintaining their polarity. When the reference output terminals are terminated with R ohms, the resistance between the input terminals is R ohms. This is true whether digital input signal $D_I$ is a logic zero or a logic one.

Therefore, the output of one cell may be terminated by the input resistance of the next cell and the final cell is terminated by a resistor having a value of R. The input resistance to a cell (looking into the $V_{R1}$ and $V_{R2}$ terminals) is expressed as $$R_{VR1,VR2} = ((R'+R)(2R))/(2R+R+R').$$

Since R'=R, the expression is reduced to $$R_{VR1,VR2} = 4R^2/4R = R$$

where $R_{VR1,VR2}$ is the input resistance looking into the $V_{R1}$ and $V_{R2}$ terminals of the switched resistor SYMAD cell.

The magnitudes of reference voltages $V_{R1}$ and $V_{R2}$ are selected by the user, however the selection must take into consideration the magnitude range of the analog input signal. For example, if a worst case analog input signal has a range of zero to three volts, then to maximize the resolution of the data output, the user may select $V_{R2}=0$ and $V_{R1}=3V$.

Figure 11A:
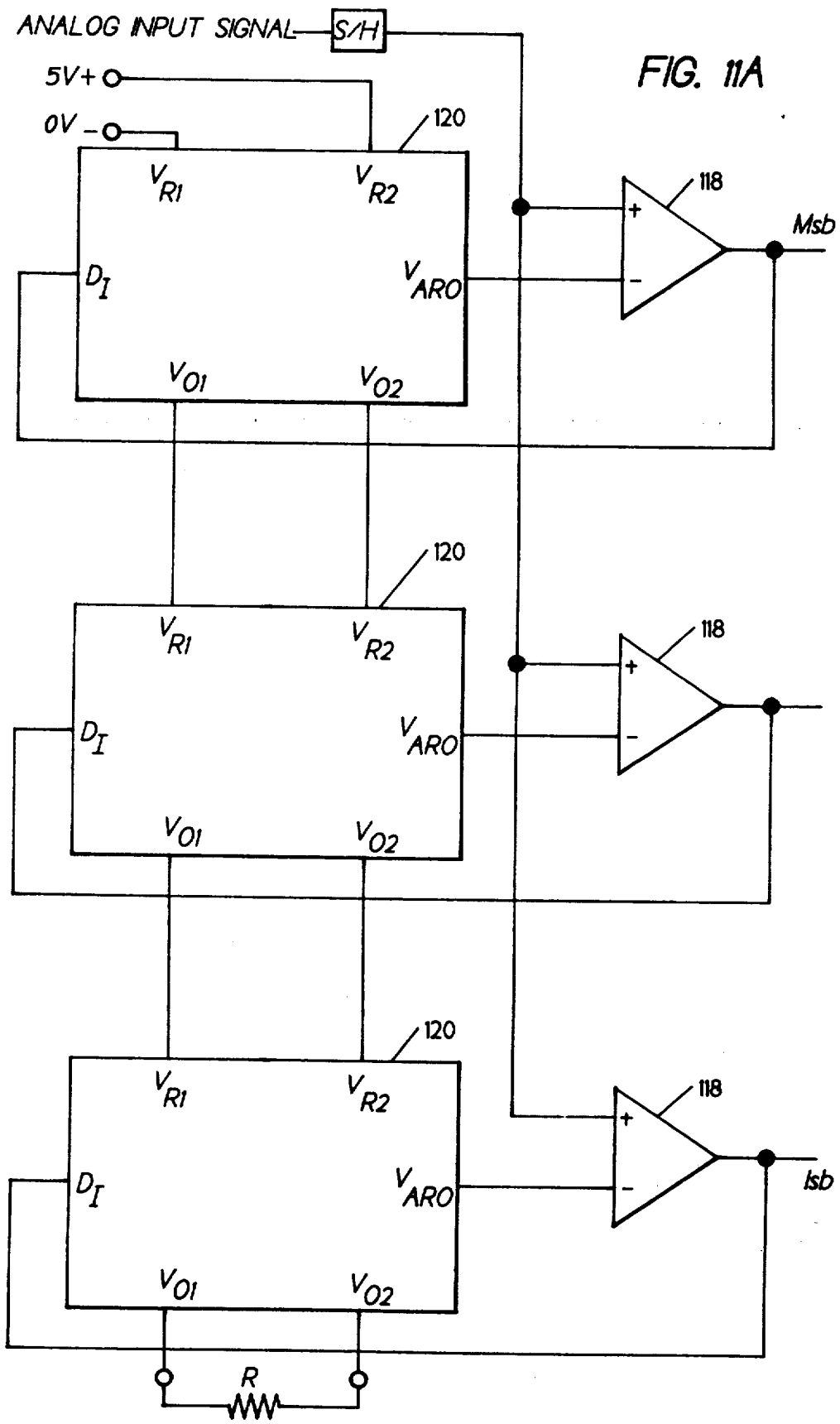
FIG. 11A is a block diagram of a three bit A/D converter utilizing switched resistor SYMAD converter cells.
Figure 11B:
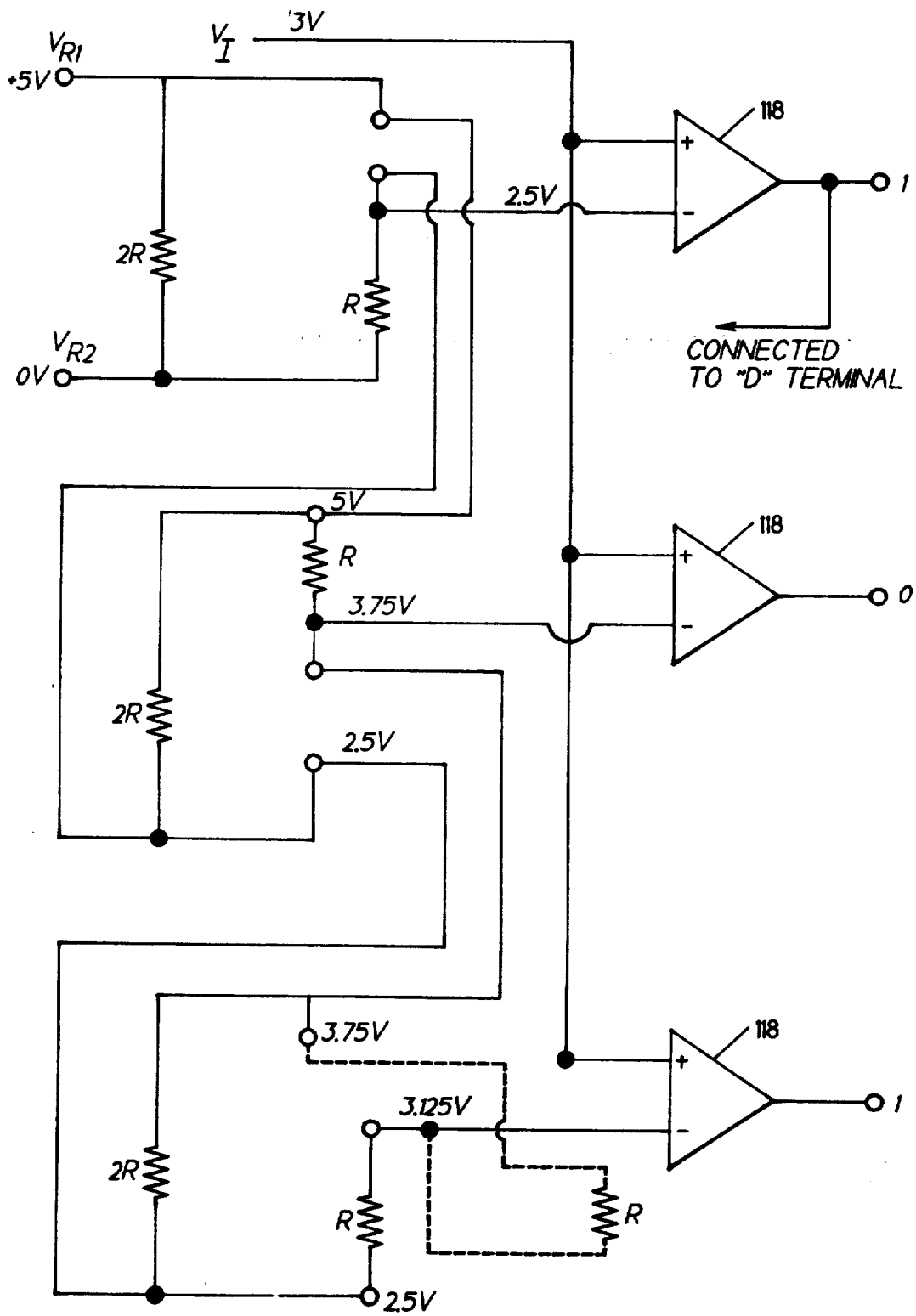
FIG. 11B illustrates the operation of a three bit analog to digital converter utilizing the switched resistor SYMAD cells.

FIGS. 11A and 11B illustrate this configuration. The comparator output of each stage sets up the configuration for that cell. This configuration determines the references voltages $V_{R1}$ and $V_{R2}$ for the next cell.

Figure 11C:
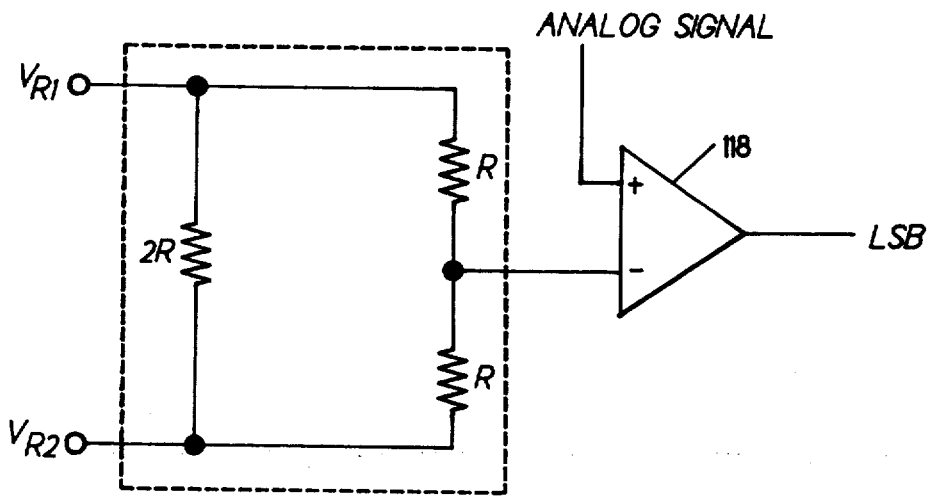
FIG. 11C is a schematic diagram showing a resistor network that may be employed in place of a LSB switching resistor SYMAD converter cell.

This pattern is repeated for N bits. It should be noted that the last cell is terminated with R. It is also within the scope of the invention to construct the last cell with a resistor network as shown in FIG. 11C.

Figure 12A:
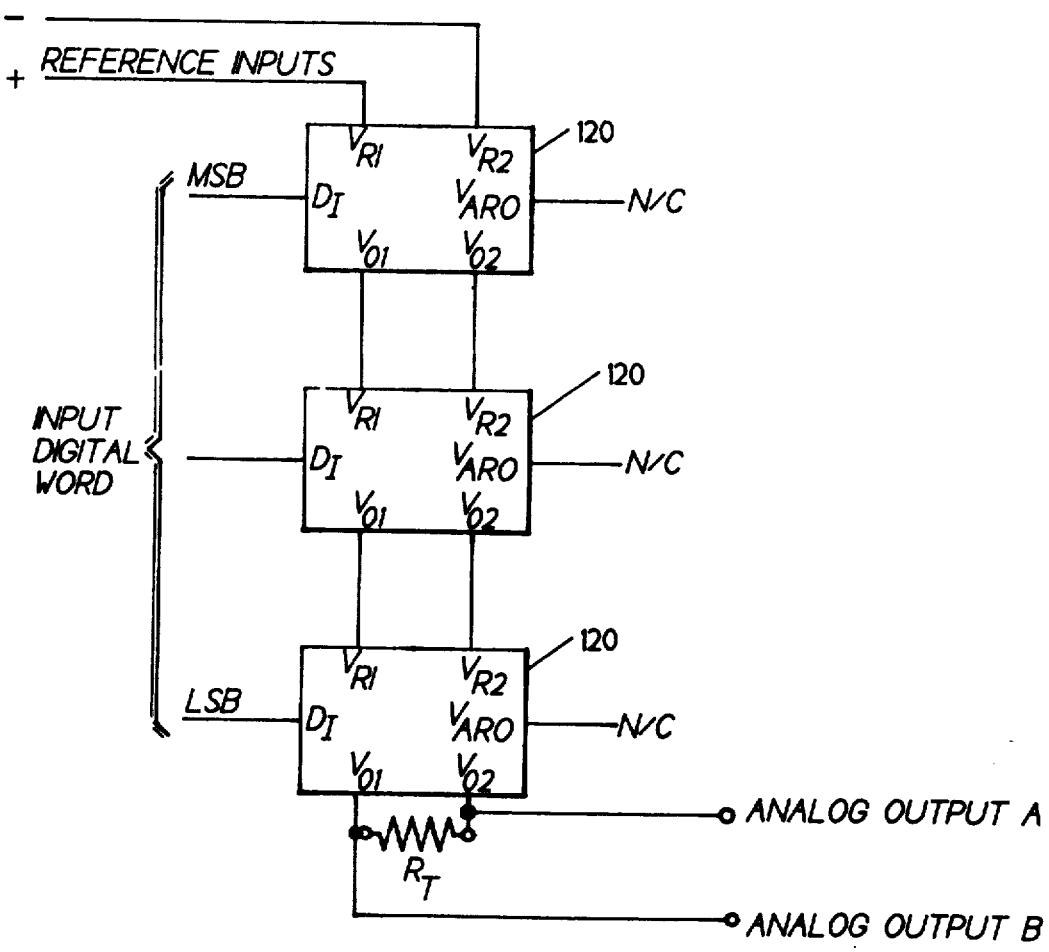
FIG. 12A is a block diagram of a DAC utilizing switching resistor SYMAD cells.

A major advantage of the switched resistor SYMAD cell is that it can also be used to construct a digital to analog converter. The comparator circuitry is not needed for the DAC function. FIG. 12A shows a three bit DAC utilizing three switched resistor SYMAD cells in the DAC mode.

The values of $V_{R1}$ and $V_{R2}$ are dependent upon the desired range of the analog output. For example, a user desires an output voltage range from 0-1v with 3-bits of resolution. $V_{R2}$ is set to zero and $V_{R1}$ is set to 1 volt. The output voltage per binary input is shown in the following table.

| BINARY NUMBER | ANALOG OUTPUT (VOLTS) | |
|---|---|---|
| | A | B |
| 000 | 0.000 | 0.125 |
| 001 | 0.125 | 0.250 |
| 010 | 0.250 | 0.375 |
| 011 | 0.375 | 0.500 |
| 100 | 0.500 | 0.625 |
| 101 | 0.625 | 0.750 |
| 110 | 0.750 | 0.875 |
| 111 | 0.875 | 1.000 |

Figure 12B:
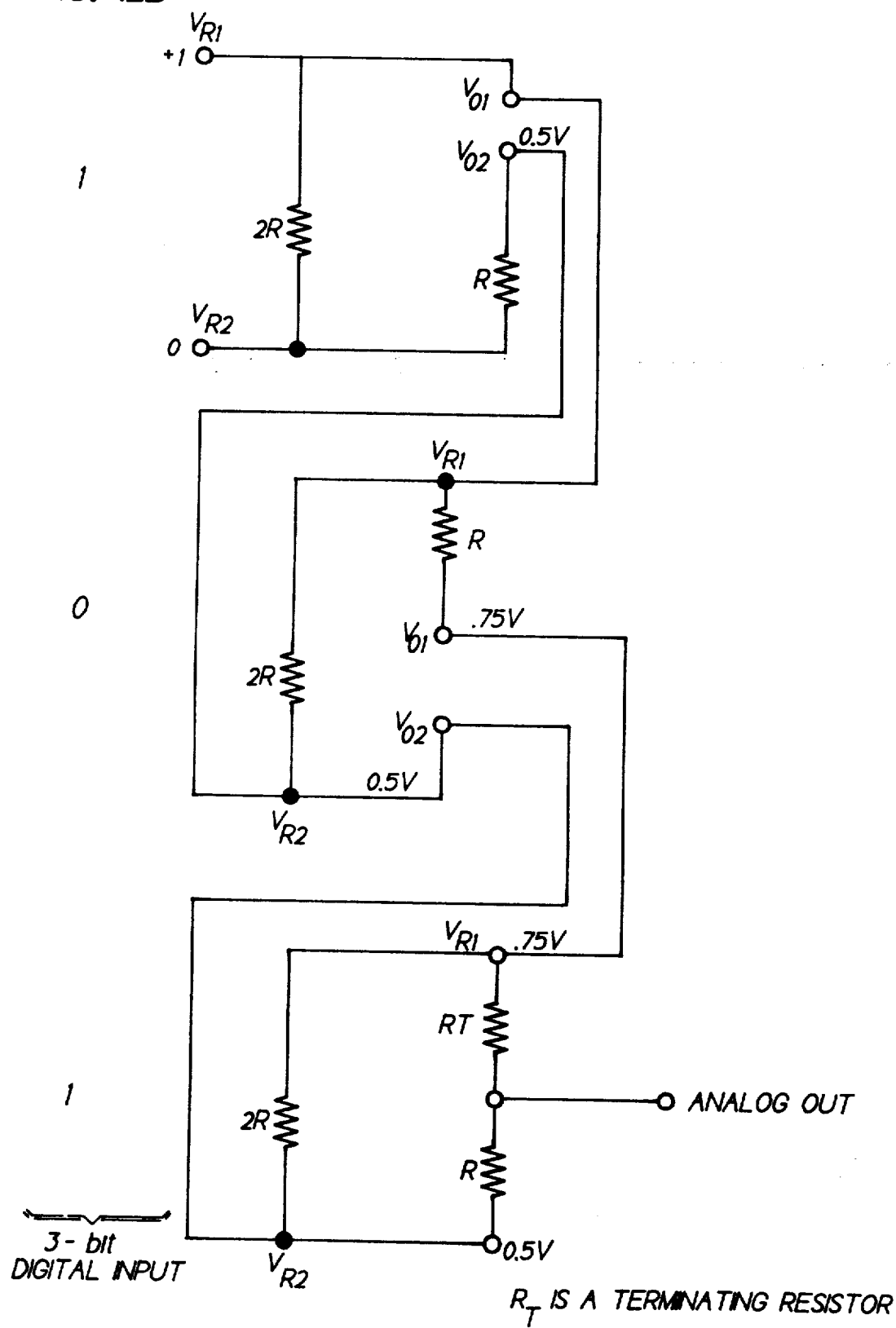
FIG. 12B is an illustration of the operation of a three bit DAC utilizing switched resistor SYMAD cells.

The magnitude range of the analog output signals is from 0.000 volts to 0.875 volts. FIG. 12B illustrates the use of three switched resistor SYMAD cells to convert the 3-bit binary word 101, which represents the decimal number 5, into 0.625 volts.

The maximum output voltage swing is 0.875 volts, or one LSB less than the full scale voltage. The user may select either leg of the terminating resistor for output or replace $R_T$ with a voltage divider or potentiometer to obtain a desired output.

Figure 10E:
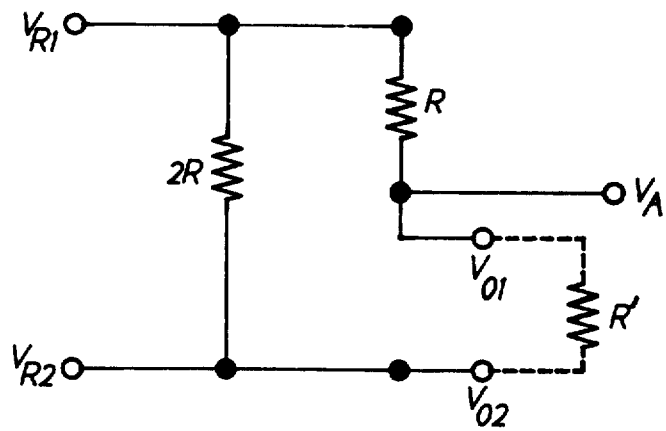
FIG. 10E illustrates the switched resistor SYMAD converter cell configuration with a logic zero applied at the $D_I$ terminal.

Since the MSB of the 3-bit binary word input (digital input) is a 1, the first switched resistor SYMAD cell, through the internal switching, is configured as shown in the schematic diagram of FIG. 10D. The second bit of the 3-bit binary word is a 0, therefore the second switched resistor SYMAD cell is configured as shown in the schematic diagram of FIG. 10E. The LSB of the 3-bit binary word is a 1, therefore the last switched resistor SYMAD cell is configured as in the schematic diagram of FIG. 10D. The first cell's reference outputs $V_{01}$ and $V_{02}$, determine the second cell's input references $V_{R1}$ and $V_{R2}$. The second cells reference outputs, $V_{01}$ and $V_{02}$, determine the third cell's input references, $V_{R1}$ and $V_{R2}$. The analog output signal is taken from the bottom leg of $R_T$, the terminating resistor of the LSB switched resistor SYMAD cell.

If the analog output is buffered by a JFET amplifier, then a large value of R can be used in each cell, and the circuit consumes less power. A large value of R also reduces the noise figure at the output.

In both the ADC and DAC configurations the positive reference output is expressed as:

$$V_{01} = (dV_{R1}) + (1-d)((V_{R1}+V_{R2})/2.$$

The negative reference output is expressed as:

$$V_{02} = (1-d)(V_{R2}) + d(V_{R1}+V_{R2})/2,$$

where d=1 when D=logic high,
else d=0, and where D is the digital input signal.
When d=1, indicating a logic one, $V_{01}$ and $V_{02}$ are expressed as:

$$V_{01} = V_{R1}, \text{ and}$$

$$V_{02} = (V_{R1}+V_{R2})/2.$$

When d=0, indicating a logic zero, and are expressed as:

$$V_{01} = (V_{R1}+V_{R2})/2, \text{ and}$$

$$V_{02} = V_{R2}.$$

When the switches within the switched resistor SYMAD cell switch from one position to the other, there is a short period when all three terminals are open. This condition will float the $V_{ARO}$ terminal, which may cause the comparator to toggle.

Figure 10G:
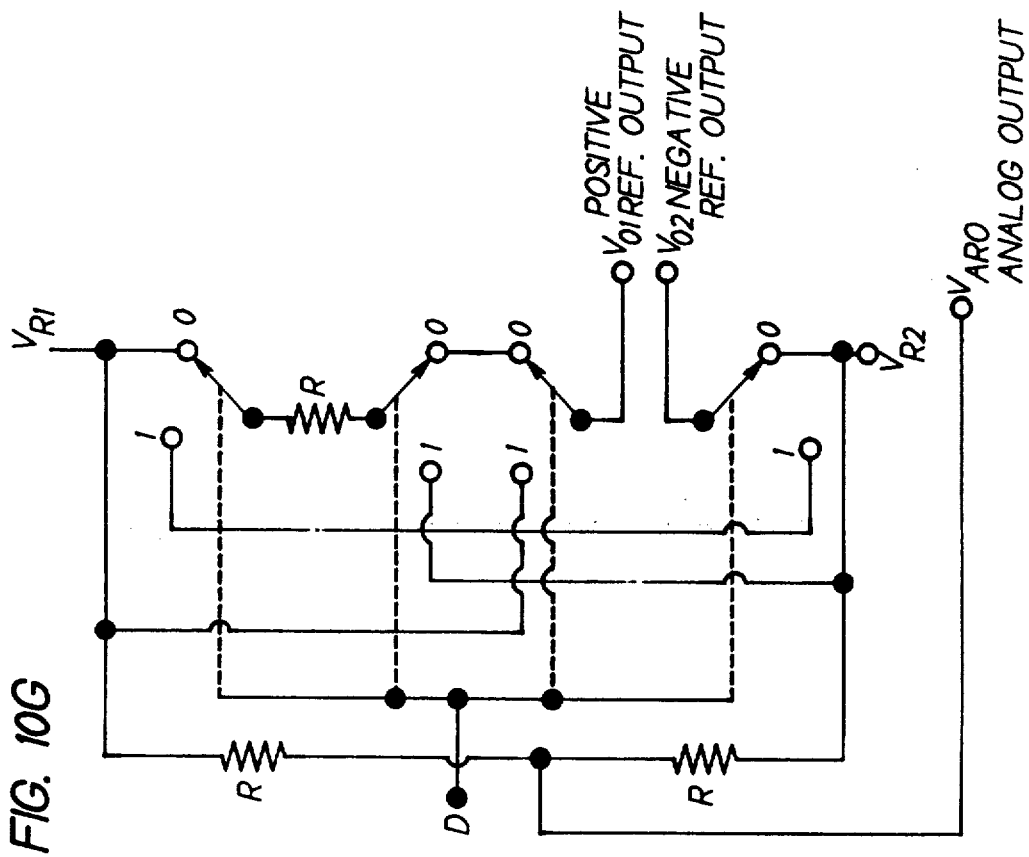
FIG. 10G shows a detailed schematic of an alternate version of a switched resistor network.
Figure 10F:
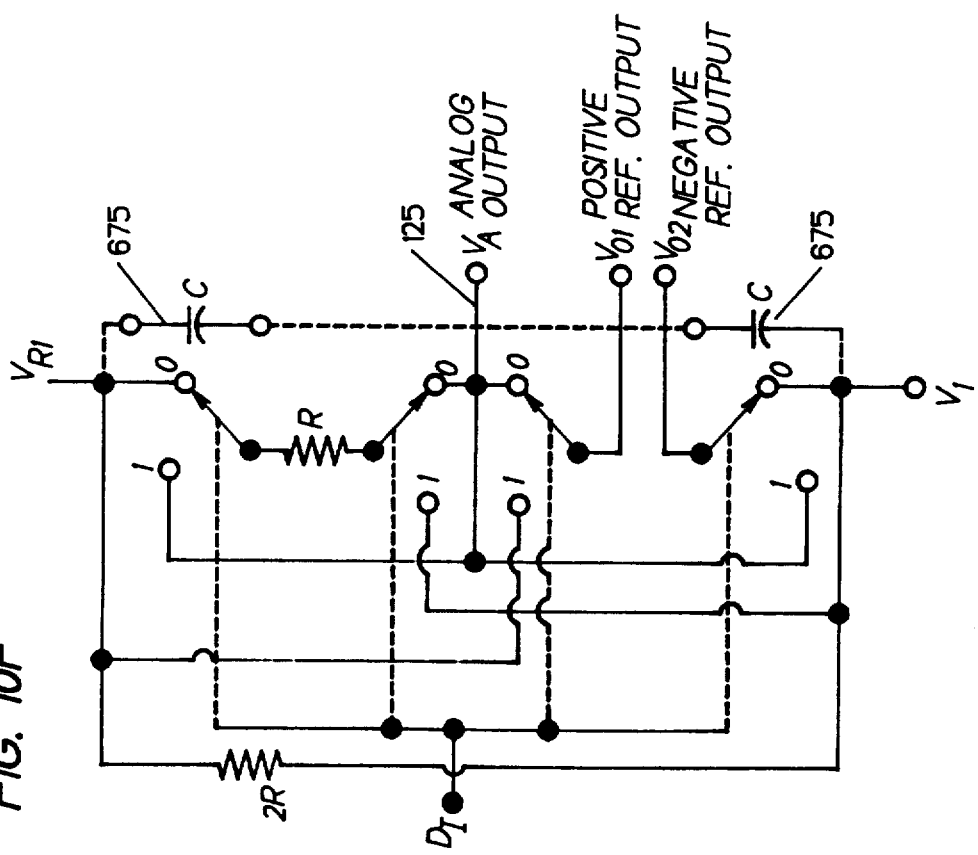
FIG. 10F is a detailed schematic of a switched resistor SYMAD cell with capacitors to reduce output switching spikes.

FIGS. 10F shows one of two methods to overcome this problem. Low leakage capacitors 675 are placed either across the center node and $V_{R1}$, or the center node and $V_{R2}$. Ceramic disk-type capacitors are suitable for this purpose.

Another alternative is to use the circuit shown in FIG. 10G. In this circuit, the resistor 2R is replaced by two resistors each having a value of R. The $V_{ARO}$ signal is taken at the center point between these two resistors. This center point provides a stable voltage level that is not affected by the switching functions. If, however, the resistor values are not identical, and vary considerably, then is not exactly one-half $V_{R1}+V_{R2}$. This, however can be remedied by using two potentiometers in place of the two fixed resistors so as to adjust the midpoint potential to a desired value while also providing for network calibration.

Figure 13:
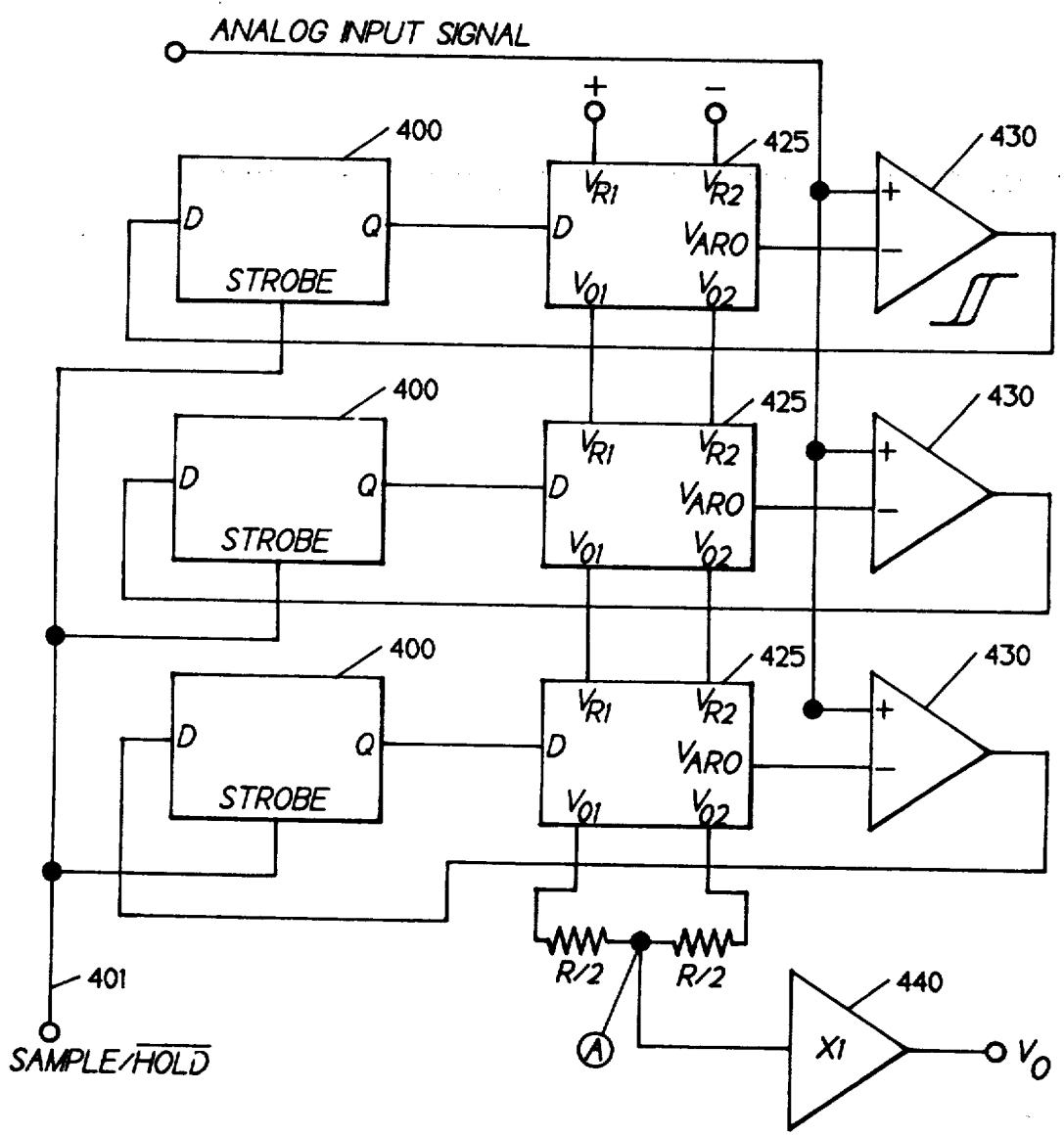
FIG. 13 is a illustration of operation of an analog memory utilizing switched resistor SYMAD converter cells.

FIG. 13 shows an analog memory utilizing switched resistor SYMAD converter cells. When the Sample/Hold 401 line shifts to a logic 1 level, the transparent latches 400 pass the input data to the "D" inputs of the switched resistor SYMAD cells. The comparators 430 are configured in such a manner as to exhibit hysteresis. The output of each comparator 430 determines whether the configuration of the switched resistor SYMAD cell is that of FIG. 10D or 10E. The preceding cell determines the reference voltages to be used in the succeeding cell. When the cells have settled, the input voltage is between $V_{01}$ and $V_{02}$ of every cell. However, because the difference between $V_{01}$ and $V_{02}$ of the last stage is smallest, they are employed to generate the output signal. To further reduce the error between input voltage and output voltage the potential that exist at the midpoint between $V_{01}$ and $V_{02}$ of the final stage is used. This is accomplished with a terminating "divide-by-two" network shown in FIG. 13. This produces at node A a voltage that is half way between $V_{01}$ and $V_{02}$ of the final stage. This voltage is buffered by an amplifier to maintain signal integrity, if required.

This selection of the midpoint voltage at A ensures that the worst case error, the difference between input voltage and output voltage, is no greater than $(V_{01}-V_{02})/2$, where $V_{01}$ and $V_{02}$ are of the final stage. This can further be expressed as a worst case % error:

$$\pm(\tfrac{1}{2}^{n+1})\times 100,$$

where n = number of bits used.

For optimum results, a stable analog input signal is maintained during the sampling period.

The buffer amplifier 440 is preferably a JFET op-amp, exhibiting high input resistance and low offset current and voltages. A suitable op-amp is the National Semiconductor LF 411. A suitable transparent latch 400 is the 74LS373. This analog memory may be used for such applications as storing error signals or offset voltages. If this analog memory is used in the previously described chopper stabilized ADC, it samples during the zeroing mode, and holds during the conversion mode.

Figure 14A:
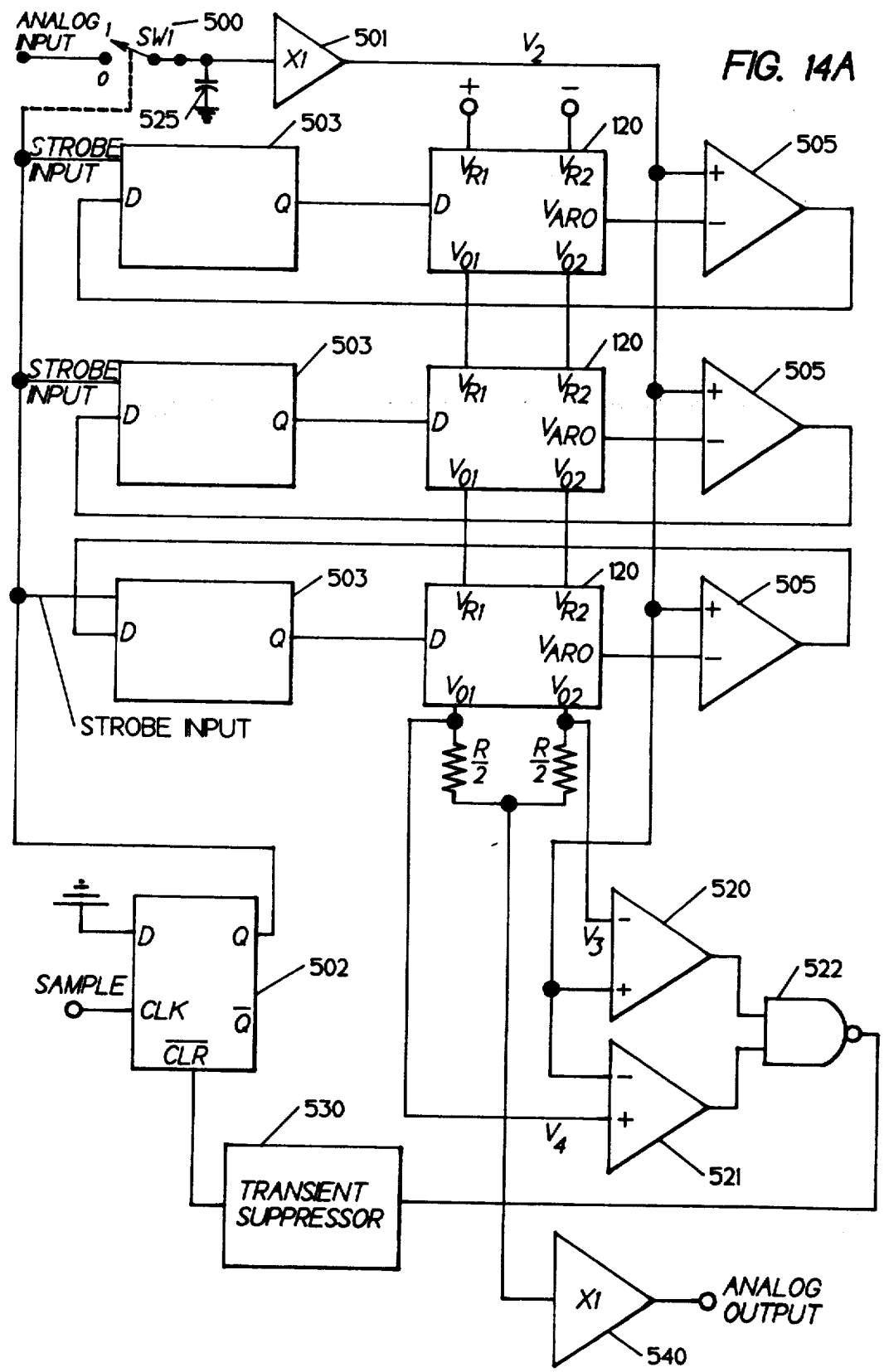
FIG. 14A is a schematic diagram of an edge triggered sample and hold circuit utilizing switching resistor SYMAD converter cells.

FIG. 14A shows switched resistor SYMAD converter cells used in realizing an edge triggered sample and hold. Switch 500 is normally closed. When the Q output of flip-flop 502 switches to a logic one, on a rising clock edge, switch 500 opens and the transparent latches 503 become transparent. Capacitor 525 and buffer amplifier 501 hold the signal for a time sufficient for the converter to stabilize. When the conversion is complete (the replica of the analog input signal is produced), the input signal $V_2$ is between $V_3$ ($V_{O2}$) and $V_4$ ($V_{O1}$). The window comparator is comprised of a comparator 520, to determine when the input signal (to the window comparator) is below a threshold ($V_3$), and a comparator 521, to determine when the input signal (to the window comparator) is above a threshold ($V_4$). The outputs of comparators 520 and 521 are coupled to the inputs of a nand gate 522, which produces the DONE signal. A logic zero DONE signal signifies that the conversion is complete and clears flip-flop 502.

Figure 14C:
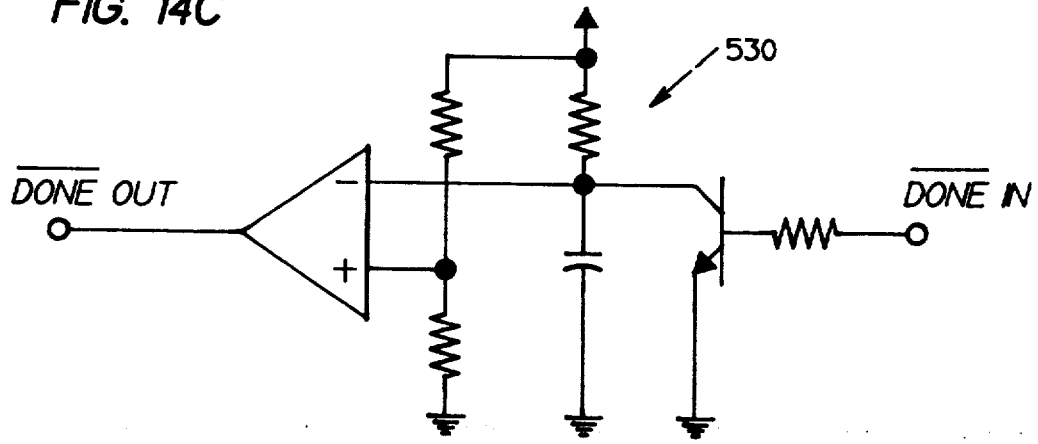
FIG. 14C is a schematic diagram of a presently preferred transient suppressor.
Figure 14B:
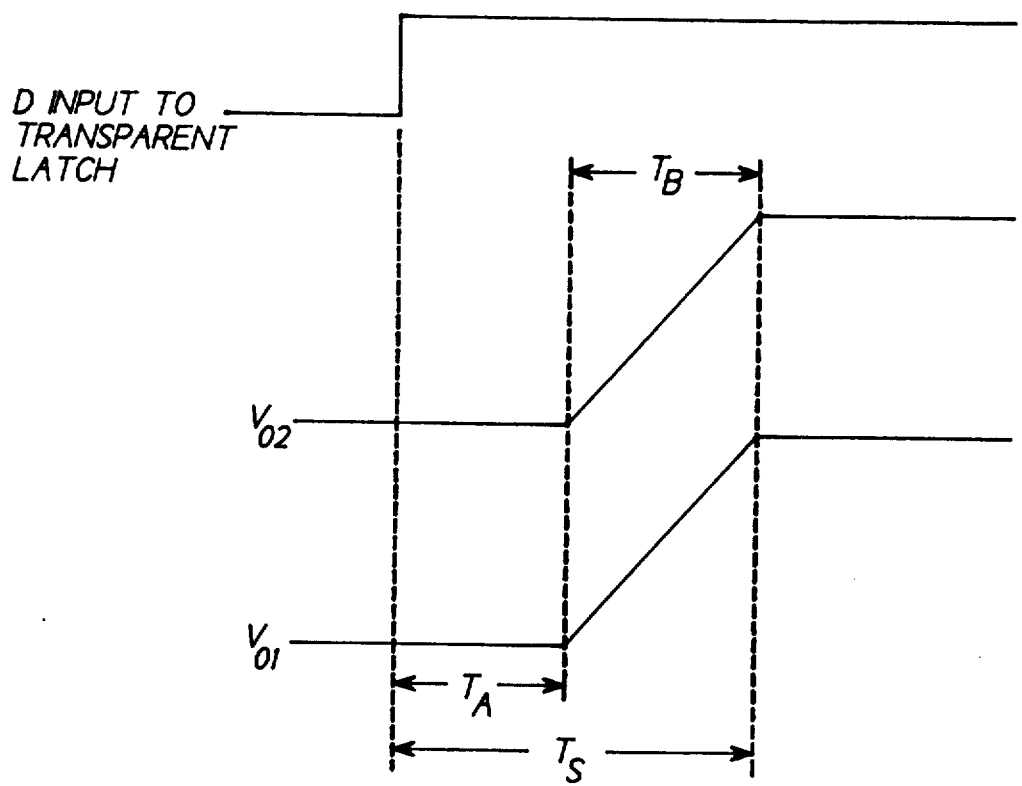
FIG. 14B illustrates the settling time of the switching resistor SYMAD cell.

In order to prevent the reception of false DONE signals while the converter is switching, a transient suppressor 530 may be employed, as depicted in FIG. 14C. The transient suppressor 530 passes a DONE signal only if it is stable for more than $T_S$ seconds; $T_S$ being the time required for the switched resistor SYMAD converter cell to switch and stabilize. $T_S$ is comprised of two components, $T_A$ and $T_B$, $T_A$ being the propagation delay from the time the data enters the cell from the transparent latches until the switches within the cell toggle, and $T_B$ is the time for the reference voltages to rise or fall to $(100/2^n)$ percent of the full scale voltage $V_{FS}$ (n is the number of bits). The analog output signal is expressed as $$V_0=(V_{01}+V_{02})/2.$$

In FIG. 14A, $V_{01}=V_4$ and $V_{02}=V_3$, therefore $$V_0=(V_3+V_4)/2.$$

Capacitor 525 is preferably of the low leakage mylar type. The buffer amplifiers 501 and 540 are preferably of the JFET type with high input resistance and low offset current and voltages. A suitable rising edge triggered flip-flop 502 is the 74LS74.

As was previously stated, an important aspect of the invention is that each SYMAD cell is identically constructed. As a result, and referring to FIG. 15, a plurality of SYMAD cells 12, 120 or 200 may be fabricated as a PCA (Programmable Converter Array) upon a monolithic substrate 50, along with Sample and Hold circuitry 52 and, if desired, a plurality of flip-flops 54. Before use, a user defines a particular ADC embodiment, such as those depicted in FIGS. 2I, 2K, 3, 4, 5, 7A, 8, 9A, 11A, 12A, 13 and 14A, and modifies the provided interconnections between components so as to interconnect the components in a desired manner. Circuit modification may be achieved electrically, by burning out fusible links, or optically with a laser. Different ADC configurations can be realized, such as a single high resolution multi-bit ADC, or multiple lower resolution ADCS, i.e. three separate 4-bit ADC functions. If switched resistor SYMAD cells also are also utilized, then hybrid configurations can be realized, i.e. combining ADC functions with DAC functions.

The preferred embodiments of the invention employ switches of the field-effect-transistor (FET) variety, however, any suitable switch may be used, such as an electro-mechanical relay.

The preferred embodiments of the invention also employ a comparator having hysterisis input characteristics and a TTL-compatible output, however, an ECL-type comparator may also be used. The hysterisis is preferably no larger than $\tfrac{1}{4}$ the LSB voltage.

Thus, although the invention has been particularly shown and described with respect to presently preferred embodiments thereof, it will be understood by those skilled in the art that changes in form and detail may be made therein without departing from the scope and spirit of the invention.

What is claimed is:

1. An analog to digital converter comprising a first analog to digital converter cell and a second analog to digital cell, each of said cells comprising:

means for comparing an analog input signal to a first reference signal, said comparing means having an output for providing a signal that indicates whether a magnitude of the analog input signal is greater than or less than the first reference signal;

means for providing an analog output signal expressive of an algebraic function of the magnitude of the analog input signal;

means for repetitively coupling the analog output signal of said cell to an input of said comparing means;

means for alternately selecting either the first analog to digital converter cell or the second analog to digital converter cell to convert the analog input signal to an n-bit representation thereof; and wherein each of said analog to digital converter cells includes means for zeroing an error voltage during a time that the other analog to digital converter cell is selected for converting the analog input signal.

2. An analog to digital converter as described in claim 1 where said cell further comprises:

means for coupling either the first reference signal or a second reference signal to the providing means, said coupling means being responsive to said output of said comparing means for selecting either the first reference signal or the second reference signal for coupling to the providing means.

3. An analog to digital converter described in claim 1 wherein the repetitive coupling means comprises:

first sample and hold means having a first input to an analog output terminal of the cell;

second sample and hold means having a first input and an output coupled to an analog signal input terminal of the cell;

switch means having a first input node coupled to said analog input signal and a second input node coupled to an output of said first sample and hold means; and means for activating said switch means such that, for a first conversion of a plurality (n) of conversions, said first input node of said switch means is coupled to said output node and for all subsequent conversions said second input node of said switch means is coupled to said output node.

4. An analog to digital converter described in claim 3 wherein the repetitive coupling means further comprises:

means for generating a first clock signal waveform to be coupled to a second input of the first sample and hold means, enabling said first sample and hold means to sample the analog output signal of said cell;

means for generating a second clock signal waveform to be coupled to a second input of the second sample hold means, enabling said second sample and hold means to sample either the analog input signal or the output of said first sample and hold means; and means for generating a control signal, said switch means being responsive to said control signal for coupling either the analog input signal or the output of said first sample and hold means to the input of said second sample and hold means.

5. An analog to digital converter as set forth in claim 1 wherein the zeroing means includes and integrator means that is switchably coupled to the output of the associated providing means.

6. An analog to digital converter as set forth in claim 1 and further comprising means, coupled to said output of said comparing means, for accumulating n-signals therefrom, wherein n equals a desired number of bits of conversion resolution.

7. A circuit comprising a plurality of circuit cells, each of said circuit cells having a first input node, a second input node, a first output node and a second output node, each of said circuit cells comprising:

a first resistance coupled between the first input node and the second input node;

a plurality of switch means; and a second resistance, the second resistance being coupled to said plurality of switch means for being switchably coupled between, in a first state, the first input node and the first output node, and, in a second state, between the second input node and the second output node, and wherein in the first state the second output node is switchably coupled to the second input node and in the second state the first output node is switchably coupled to the first input node.

8. A circuit as set forth in claim 7 wherein the first input node of a circuit cell is coupled to the first output node of a preceding circuit cell, and the second input node of the circuit cell is coupled to the second output node of the preceding circuit cell.

9. A circuit as set forth in claim 7 wherein the first resistance has a resistance value equal to twice the resistance value of the second resistance.

10. A circuit as set forth in claim 7 wherein each of said circuit cells is formed on a common substrate, and further including a plurality of programmable link means formed on the substrate for coupling said circuit cells to one another in a desired configuration.

11. A circuit as set forth in claim 7 wherein the circuit operates as a digital to analog converter having an (n) digital bit input and an analog voltage output, wherein there are (n) circuit cells connected together in a series configuration, wherein a first circuit cell of the (n) circuit cells has the first input node coupled to a first reference signal, wherein the first circuit cell has the second input node coupled to a second reference signal, wherein the first output node of the first circuit cell is coupled to the first input node of a second cell, wherein the second output node of the first circuit cell is coupled to the second input node of the second cell, wherein said switch means of each of said (n) circuit cells is coupled to one bit of the (n) bit digital signal for being operated thereby for switching between said first state and said second state, wherein the first and the second output nodes of an (n)th one of said (n) circuit cells have a terminating resistance coupled therebetween, and wherein the analog voltage output is developed between said terminating resistance and said second resistance of said (n)th circuit cell.

12. A circuit as set forth in claim 11 wherein said first circuit cell is coupled to a most significant bit of the (n) digital bit input.

13. A circuit as set forth in claim 11 wherein the terminating resistance has a resistance value approximately equal to a resistance value of the second resistance.

14. A circuit as set forth in claim 11 wherein the analog voltage output varies between V1 and V2, and wherein said first reference signal is a voltage equal to V1 and wherein said second resistance signal is a voltage signal to V2.

15. A circuit as set forth in claim 7 wherein the circuit operates as an analog to digital converter having an analog voltage input signal and an (n) digital bit output, wherein there are (n) circuit cells connected together in a series configuration, wherein a first circuit cell of the (n) circuit cells has the first input node coupled to a first reference signal, wherein the first circuit cell has the second input node coupled to a second reference signal, wherein the first output node of the first circuit cell is coupled to the first input node of a second cell, wherein the second output node of the first circuit cell is coupled to the second input node of the second cell, wherein each of said circuit cells includes a third output node, the third output node being coupled to said plurality of switch means for being switchably coupled to, in the first state, the first output node and, in the second state, to the second output node, wherein the third output node of each of said (n) circuit cells is coupled to a first input of a corresponding one of (n) comparison means, a second input of each of said (n) comparison means is coupled to the analog voltage input signal, each of said (n) comparison means having an output for indicating if a magnitude of the analog voltage signal input is greater than or less than a magnitude of a voltage signal appearing on said third output node of the corresponding one of said (n) circuit cells, and wherein said switch means of each of said (n) circuit cells is coupled to said output of the corresponding one of said (n) comparison means for being operated thereby for switching between said first state and said second state.

16. A circuit as set forth in claim 15 wherein said output of the comparison means that is coupled to said third node of said first circuit cell is a most significant bit of the (n) bit digital bit output.

17. A circuit as set forth in claim 15 wherein the first and the second output nodes of an (n)th one of said (n) circuit cells have a terminating resistance coupled therebetween, and wherein the terminating resistance has a resistance value approximately equal to a resistance value of the second resistance.

18. A circuit as set forth in claim 15 wherein each of said circuit cells and each of said comparison means is formed on a common substrate, and further including a plurality of programmable link means for coupling said circuit cells to one another and to said comparison means in a desired configuration.

19. A circuit as set forth in claim 15 wherein said switch means of each of said (n) circuit cells is coupled to said output of the corresponding one of said (n) comparison means through a digital latch means that stores the (n) bit digital output for maintaining said switching means of each of said circuit cells in a desired configuration, wherein the first and the second output nodes of an (n)th one of said (n) circuit cells have a terminating resistance coupled therebetween, and wherein an analog output voltage is obtained from said terminating resistance.

20. A circuit as set forth in claim 19 and further including a sample and hold means having an input coupled to the analog voltage input signal and an output coupled to said second input of each of said comparison means, and further including window comparison means having input coupled to said first and said second output nodes of said (n)th one of said (n) circuit cells, inputs coupled to said output of said sample and hold means, and an output coupled to a clock input of each of said digital latch means.

21. An analog to digital logarithmic converter circuit for converting an analog input signal to an (n) bit digital output that is a base 2 logarithmic expression of the analog input signal, the circuit comprising:

(n) circuit cells, each of said (n) circuit cells having a first input node, a second input node, a first output node and a second output node, said (n) circuit cells being serially coupled together in such a manner that said second output node of a first circuit cell is coupled to said first input node of said second circuit cell, each of said (n) circuit cells outputting one digital bit of the base 2 logarithmic expression, (n) being the order of the digital output bit wherein an (n)th circuit cell outputs an (n)th digital output bit, each of said (n) circuit cells comprising:

means for comparing an analog input signal that is coupled to said first input node to a reference signal that is coupled to said second input node, a magnitude of said reference signal being a function of the order of a corresponding digital output bit, said comparing means having an output coupled to said first output node for providing a bit of the (n) bit digital output, a state of the bit indicating whether a magnitude of the analog input signal is greater than or less than the magnitude of the reference signal;

means for providing a first analog signal having a magnitude that is a function of the analog input signal multiplied by a predetermined factor that is a function of the order (n) of the digital output bit to which said circuit cell corresponds to;

means for providing a second analog signal having a magnitude equal to the magnitude of the analog input signal; and switching means, coupled to the output of said comparing means and responsive to the state of the bit output thereby, for switchably coupling either the first analog signal or the second analog signal to the second output node.

22. An analog to digital converter circuit as set forth in claim 21 wherein the predetermined factor is expressive of the function Q(n), wherein Q(n) is a mantissa multiplier that is exponentially weighted by the order of the output bit.

23. An analog to digital converter circuit as set forth in claim 21 wherein for each of said circuit cells, the analog input is multiplied by a predetermined factor that implements division, and wherein said switching means couples said first analog signal to said second output node when a magnitude of said analog input signal is greater than a magnitude of said reference signal.

24. An analog to digital converter circuit as set forth in claim 21 wherein said switching means couples said first analog signal to said second output node when a magnitude of said analog input signal is less than a magnitude of said reference signal.

25. An analog to digital converter circuit as set forth in claim 21 having a first plurality of said circuit cells serially coupled together for implementing logarithmic division, wherein said switching means couples said first analog signal to said second output node when a magnitude of said analog input signal is greater than a magnitude of said reference signal; said analog to digital converter circuit further having a second plurality of said circuit cells serially coupled together for implementing logarithmic multiplication, wherein said switching means couples said first analog signal to said second output node when a magnitude of said analog input signal is less than a magnitude of said reference signal; and further including means for adding a bit output from one of said first plurality of circuit cells to corresponding bit output from one of said second plurality of circuit cells.

26. An analog to digital converter as set forth in claim 25 and further including second means for comparing said analog input signal to a zero reference signal and, responsive to the result of said comparison, for providing a signal that is expressive of a sign of the (n) bit digital output, and further including means, responsive to the sign, for rectifying the polarity of the analog input signal to the first and second plurality of converter cells.

27. A programmable converter array, comprising a plurality of converter cells formed on a common substrate, and further including a plurality of programmable link means formed on the substrate for coupling the converter cells to one another in a desired configuration, the converter cells comprising means for processing an analog signal.

28. The programmable converter array as set forth in claim 27, wherein each converter cell comprises a first input node, a second input node, a first output node and a second output node, each of said circuit cells further comprising:
  a first resistance coupled between the first input node and the second input node;
  a plurality of switch means; and
  a second resistance, the second resistance being coupled to said plurality of switch means for being switchably coupled between, in a first state, the first input node and the first output node, and, in a second state, between the second input node and the second output node, and wherein
  in the first state the second output node is switchably coupled to the second input node and in the second state the first output node is switchably coupled to the first input node.

29. The programmable converter array as set forth in claim 27 wherein the programmable links are formed in such a manner to configure (n) circuit cells as an analog to digital converter circuit for converting an analog input signal to an (n) bit digital output that is a base 2 logarithmic expression of the analog input signal, each of said (n) circuit cells comprising:
  a first input node, a second input node, a first output node and a second output node, said (n) circuit cells being serially coupled together in such a manner that said second output node of a first circuit cell is coupled to said first input node of said second cell, each of said (n) circuit cells outputting one digital bit of the base 2 logarithmic expression, (n) being the order of the digital output bit wherein an (n)th circuit cell outputs an (n)th digital output bit, each of said (n) circuit cells comprising:
  means for comparing an analog input signal that is coupled to said first input node to a reference signal that is coupled to said second input node, a magnitude of said reference signal being a function of the order of a corresponding digital output bit, said comparing means having an output coupled to said first output node for providing a bit of the (n) bit digital output, a state of the bit indicating whether a magnitude of the analog input signal is greater than or less than the magnitude of the reference signal;
  means for providing a first analog signal having a magnitude that is a function of the analog input signal multiplied by a predetermined factor that is a function of the order (n) of the digital output bit to which said circuit cell corresponds to;
  means for providing a second analog signal having a magnitude equal to the magnitude of the analog input signal; and
  switching means, coupled to the output of said comparing means and responsive to the state of the bit output thereby, for switchably coupling either the first analog signal or the second analog signal to the second output node.

30. The programmable converter array as set forth in claim 27 wherein each converter cell comprises:
  means for comparing an analog input signal to a first reference signal, said comparing means having an output for providing a signal that indicates whether a magnitude of the analog input signal is greater than or less than the first reference signal;
  means for providing an analog input signal expressive of a difference in magnitude between the analog input signal and the first reference signal, or between the analog input signal and a second reference signal;
  means for coupling either the first reference signal or the second reference signal to the providing means, said coupling means being responsive to said output of said comparing means for selecting either the first reference signal or the second reference signal for coupling to the providing means.

31. The programmable converter array as set forth in claim 27 and further including at least one sample and hold means formed on the substrate and being coupled to said programmable link means for being programmably interconnected with the converter cells.

32. The programmable converter array as set forth in claim 27 and further including at least one digital logic circuit means formed on the substrate and being coupled to said programmable link means for being programmably interconnected with the converter cells.

33. A synchronous converter cell, comprising:
  edge-triggered sample and hold means, said edge-triggered sample and hold means comprising,
  means for comparing an analog input signal to a first reference signal, said comparing means having an output for providing a signal that indicates whether a magnitude of said analog input signal is greater than or less than said first reference signal;
  digital delay means having an input coupled to the output of said comparing means, said digital delay means having a clock input coupled to a clock signal for storing the output of said comparing means on an edge of the clock signal, said digital delay means further having an output expressive of a time-delayed version of the output of said comparing means; and
  analog delay means, having an input coupled to said analog input signal, said analog delay means having a clock input coupled to the clock signal for storing the analog input signal on the same edge of the clock signal that said digital delay means stores the output of said comparing means, said analog delay means having an output expressive of a time-delayed version of the analog input signal.

34. The synchronous converter cell as set forth in claim 35 wherein said edge-triggered sample and hold means includes:
  first switch means having a first input coupled to said analog input signal;

first sample and hold means having an input and an output, the input being coupled to a first output node of said first switch means, said first sample and hold means outputting a first sampled analog signal;

second sample and hold means having an input and an output, the input being coupled to a second output node of said first switch means, said second sample and hold means outputting a second analog signal;

second switch means having a first input node coupled to an output of said first sample and hold means and a second input node coupled to an output of said second sample and hold means, said second switch means having an output node; and means for generating a first clock signal and a second clock signal, said first clock signal being out-of-phase with said second clock signal, said first clock signal and said second clock signal activating said first switch means and said second switch means whereby when said analog input signal is coupled to the input of said first sample and hold means, the output of said second sample and hold means is coupled to said output node of said second switch means, and when said analog input signal is coupled to the input of said second sample and hold means, the output of said first sample and hold means is coupled to said output node of said second switch means.

35. The synchronous converter cell as set forth in claim 33 and further including analog signal processor means coupled to said output of said analog delay means and to said output of said digital delay means, said analog signal processor means being responsive to a state of said digital delay means output for controlling the processing of the output of said analog delay means in accordance therewith.

* * * * *

UNITED STATES PATENT AND TRADEMARK OFFICE
CERTIFICATE OF CORRECTION

PATENT NO. : 5,202,687

DATED : 4/13/93

INVENTOR(S) : Distinti

It is certified that error appears in the above-identified patent and that said Letters Patent is hereby corrected as shown below:

Col. 24, line 68, after "to" insert --a--.

Col. 26, line 65, "35" should read --33--.

Signed and Sealed this

Seventh Day of December, 1993

Attest:

Attesting Officer

BRUCE LEHMAN

Commissioner of Patents and Trademarks